United States Patent
Saida et al.

(10) Patent No.: US 9,959,919 B2
(45) Date of Patent: May 1, 2018

(54) MEMORY SYSTEM INCLUDING NON-VOLATILE MEMORY OF WHICH ACCESS SPEED IS ELECTRICALLY CONTROLLED

(71) Applicant: KABUSHIKI KAISHA TOSHIBA, Tokyo (JP)

(72) Inventors: Daisuke Saida, Tokyo (JP); Susumu Takeda, Kanagawa (JP); Hiroki Noguchi, Kanagawa (JP); Kazuhiko Abe, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 80 days.

(21) Appl. No.: 15/067,723

(22) Filed: Mar. 11, 2016

(65) Prior Publication Data
US 2016/0276008 A1 Sep. 22, 2016

(30) Foreign Application Priority Data
Mar. 20, 2015 (JP) .................. 2015-058745

(51) Int. Cl.
| | |
|---|---|
| G11C 11/00 | (2006.01) |
| G11C 7/12 | (2006.01) |
| G11C 11/16 | (2006.01) |
| G11C 29/02 | (2006.01) |
| G11C 11/18 | (2006.01) |
| G06F 12/0811 | (2016.01) |

(52) U.S. Cl.
CPC ...... *G11C 11/1659* (2013.01); *G06F 12/0811* (2013.01); *G11C 7/12* (2013.01); *G11C 11/161* (2013.01); *G11C 11/1673* (2013.01); *G11C 11/1675* (2013.01); *G11C 11/1693* (2013.01); *G11C 11/18* (2013.01); *G11C 29/023* (2013.01); *G11C 29/028* (2013.01); *G06F 2212/222* (2013.01); *G06F 2212/502* (2013.01); *G06F 2212/601* (2013.01); *Y02B 60/1225* (2013.01)

(58) Field of Classification Search
CPC .......... G11C 16/08; G11C 16/12; G11C 8/08; G11C 14/00; G11C 29/70; G11C 29/789; G11C 16/102; G11C 16/30; G11C 11/005; G11C 11/1659; G11C 16/0483
See application file for complete search history.

(56) References Cited

U.S. PATENT DOCUMENTS

| | | | |
|---|---|---|---|
| 8,443,209 B2 | 5/2013 | Nussbaum et al. | |
| 2007/0283077 A1* | 12/2007 | Klein ................ | G11C 7/1045 711/100 |

(Continued)

FOREIGN PATENT DOCUMENTS

| | | |
|---|---|---|
| JP | 2003-108438 | 4/2003 |
| JP | 2007-42135 | 2/2007 |

(Continued)

*Primary Examiner* — Hien Nguyen
(74) *Attorney, Agent, or Firm* — Finnegan, Henderson, Farabow, Garrett & Dunner, L.L.P.

(57) ABSTRACT

A memory system has a non-volatile memory of which access speed is electrically controlled, a control circuitry that selects a first region which is a portion of a memory region of the non-volatile memory, and a boost circuit that adjusts an access speed of the first region to be higher than an access speed of a second region different from the first region in the memory region.

19 Claims, 19 Drawing Sheets

(56) References Cited

U.S. PATENT DOCUMENTS

| | | | |
|---|---|---|---|
| 2010/0124140 A1* | 5/2010 | Otsuka | G11C 16/12 365/226 |
| 2015/0082062 A1* | 3/2015 | Saraswat | G06F 1/3275 713/323 |
| 2016/0240771 A1* | 8/2016 | Hu | H01L 43/08 |

FOREIGN PATENT DOCUMENTS

| | | |
|---|---|---|
| JP | 200742135 | 2/2007 |
| JP | 2013-500520 | 1/2013 |
| JP | 2015-158798 | 9/2015 |
| JP | 2015-179307 | 10/2015 |
| JP | 2015-179320 | 10/2015 |
| JP | 2016-62505 | 4/2016 |
| WO | WO 03/032169 | 4/2003 |
| WO | WO 2011/011668 | 1/2011 |
| WO | WO 2015/125971 | 8/2015 |
| WO | WO 2015/141730 | 9/2015 |
| WO | WO 2015-141731 | 9/2015 |
| WO | WO 2016/043158 | 3/2016 |

\* cited by examiner

LENGTH OF WRITE PULSE [ns]

US 9,959,919 B2

MEMORY SYSTEM INCLUDING NON-VOLATILE MEMORY OF WHICH ACCESS SPEED IS ELECTRICALLY CONTROLLED

CROSS REFERENCE TO RELATED APPLICATIONS

This application is based upon and claims the benefit of priority from the prior Japanese Patent Application No. 2015-58745, filed on Mar. 20, 2015, the entire contents of which are incorporated herein by reference.

FIELD

The present invention relate to a memory system including a non-volatile memory.

BACKGROUND

In the existing memory system, cache memories have a hierarchical structure and data which is frequently accessed is stored in a high-speed low-order cache memory. In this way, the memory access speed of the processor increases.

However, in recent years, generally, a plurality of processor cores have been provided to perform processes in parallel. When the processor cores access the cache memory in parallel, there is a concern that a cache miss is likely to occur in the existing hierarchical cache memories.

In many cases, a high-speed volatile memory, such as an SRAM, is used as the cache memory. The power consumption of the SRAM is more than that of a DRAM which is generally used as a main memory. In addition, since the SRAM is a volatile memory, power is required to maintain data even in a standby state in which the SRAM is not accessed.

DETAILED DESCRIPTION

According to one embodiment, a memory system has a non-volatile memory of which access speed is electrically controlled, a control circuitry that selects a first region which is a portion of a memory region of the non-volatile memory, and a boost circuit that adjusts an access speed of the first region to be higher than an access speed of a second region different from the first region in the memory region.

Figure 1:
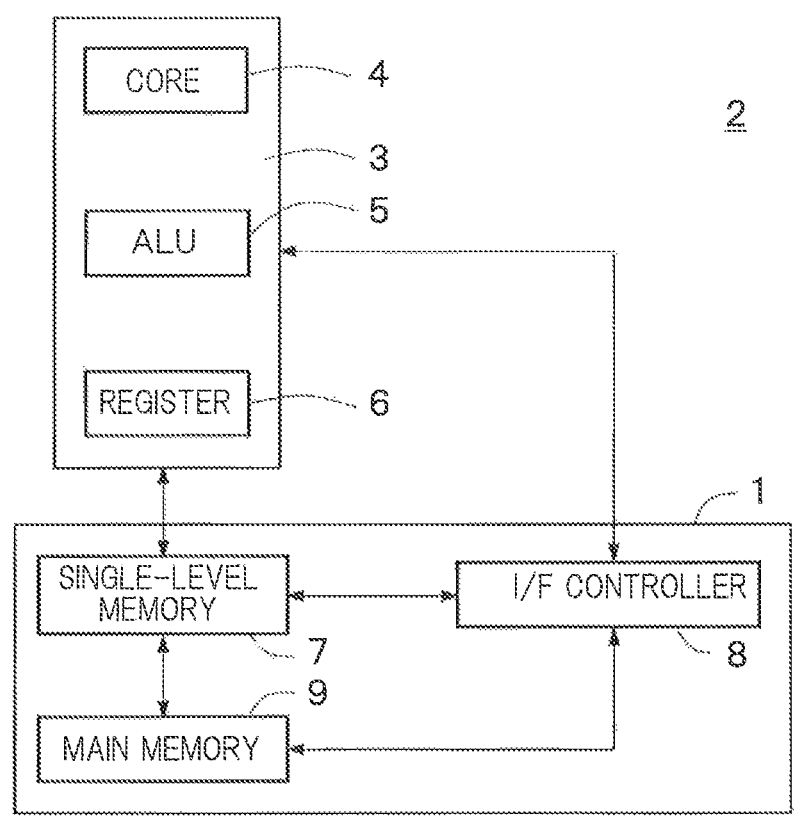
FIG. 1 is a block diagram schematically illustrating the structure of a processor system 2 including a memory system 1 according to an embodiment.

FIG. 1 is a block diagram schematically illustrating the structure of a processor system 2 including a memory system 1 according to an embodiment. The processor system 2 illustrated in FIG. 1 includes a processor 3 and the memory system 1.

The processor 3 includes a core 4, an arithmetic logic unit (ALU) 5, and a register 6. In some cases, a plurality of cores 4, a plurality of arithmetic logic units 5, and a plurality of registers 6 are provided. However, FIG. 1 illustrates a simple structure in which one core 4, one arithmetic logic unit 5, and one register 6 are provided.

The memory system 1 includes a single-level memory 7, an interface (I/F) controller (control circuitry) 8, and a main memory (main memory) 9. For example, the single-level memory 7 and the I/F controller 8 may be integrated into one chip and the main memory 9 may be provided in another chip. Alternatively, the single-level memory 7, the I/F controller 8, and the main memory 9 may be integrated into one chip. The processor 3, the single-level memory 7, and the I/F controller 8 may be integrated into one chip. Alternatively, the I/F controller 8 and the processor 3 may be integrated into one chip and the single-level memory 7 may be provided in another chip. As such, at least any two of the components of the processor system 2 illustrated in FIG. 1 may be integrated with each other. In addition, the memory system 1 according to this embodiment may not include the main memory 9. That is, the memory system 1 may not include the main memory 9 and the user may attach the main memory 9, if necessary.

The single-level memory 7 is a non-volatile memory. The type of non-volatile memory will be described below. The non-volatile memory according to this embodiment is characterized in that the access speed of each partial region can be electrically controlled. Here, the partial region is not particularly limited. For example, the partial region may be a region in which a plurality of word lines are arranged, a region in which a plurality of bit lines are arranged, each memory bank, or any other unit regions.

The non-volatile memory according to this embodiment is, for example, a magnetoresistive random access memory (MRAM). There are various types of MRAMs, which will be described in detail below.

The I/F controller 8 selects a first region which is a portion of a memory region of the single-level memory 7 that is a non-volatile memory. The first region is used to increase the access speed and may be allocated to any region or a predetermined region in the memory region of the single-level memory 7, which will be described below. The controller 8 speculatively predicts a region which the processor 3 is likely to access, on the basis of at least one of, for example, the frequency of access to the non-volatile memory and an access history, and selects the first region. In addition, the processor 3 may select the first region and the I/F controller 8 may perform a detailed process (for example, a process of issuing a command to increase an access speed to some partial regions) of selecting the first region for the single-level memory 7 in response to an instruction from the processor 3.

Figure 2:
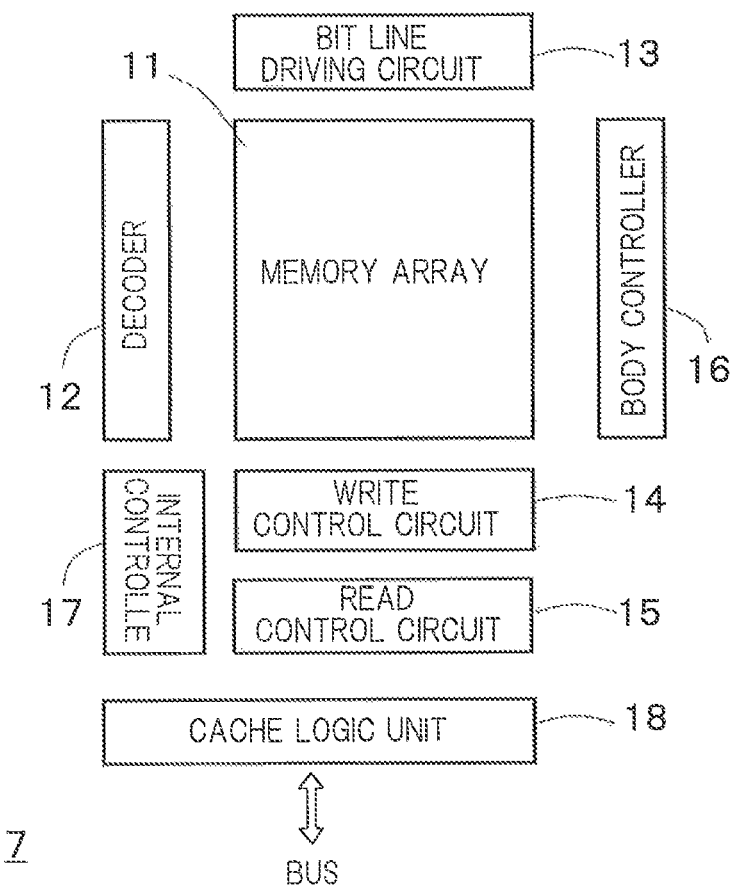
FIG. 2 is a block diagram illustrating an example of the internal structure of a single-level memory 7.

FIG. 2 is a block diagram illustrating an example of the internal structure of the single-level memory 7. It is assumed that the single-level memory 7 illustrated in FIG. 2 is used as a cache memory which has a higher access speed than the main memory 9.

The single-level memory 7 illustrated in FIG. 2 includes a memory array 11 which is a non-volatile memory, a decoder 12, a bit line driving circuit 13, a write control circuit 14, a read control circuit 15, a body controller (boost circuit) 16, an internal controller 17, and a cache logic unit 18.

In the memory array 11, a plurality of word lines and a plurality of bit lines (not illustrated) are arranged so as to intersect each other and a plurality of memory cells which store data according to the potential of each word line and each bit line are arranged in a matrix. The plurality of memory cells may be arranged in a two-dimensional plane or may be three-dimensionally arranged. When the memory cells are three-dimensionally arranged, the word lines and the bit lines also need to be three-dimensionally arranged.

The decoder 12 drives a plurality of word lines in the memory array 11 in response to an access request from the processor 3. Specifically, the decoder 12 decodes the address which is issued by the processor 3 and drives a specific word line on the basis of the decoding result.

The bit line driving circuit 13 drives a plurality of bit lines in the memory array 11 in response to an access request from the processor 3. In some cases, the bit line driving circuit 13 pre-charges and discharges of the bit lines, which will be described below.

The write control circuit 14 performs timing control for writing data to a memory cell which is a write destination when the processor 3 issues a write request.

The read control circuit 15 performs timing control for reading data from a memory cell which is a read destination when the processor 3 issues a read request.

The body controller 16 performs control such that the access speed of the first region in the single-level memory 7 is higher than the access speed of a second region other than the first region in the memory region. When the single-level memory 7 can change a substrate voltage to change the access speed as in an MRAM, the body controller 16 controls the substrate voltage for each partial region of the single-level memory 7 to change the access speed.

The body controller 16 is used to increase the access speed of a memory cell including a cell transistor in, for example, an MRAM. In general, the substrate voltage can be increased to improve the operating speed of the cell transistor which is an NMOS transistor. The body controller 16 performs control such that the substrate voltage of cell transistors in all of the memory cells in each partial region of the single-level memory 7 increases. Therefore, when a memory cell, of which the access speed is not improved even though the substrate voltage increases, is used, it is not necessary to provide the body controller 16 and a means for improving the access speed is needed as the body controller 16, which will be described in detail below.

The internal controller 17 controls the decoder 12, the bit line driving circuit 13, the write control circuit 14, and the read control circuit 15 in response to an instruction from the cache logic unit 18.

The cache logic unit 18 interprets a command from the I/F controller 8 and transmits an instruction to the internal controller 17. In addition, the cache logic unit 18 transmits the address, control signal, or data transmitted from the I/F controller 8 to the units of the single-level memory 7 and switches a read process and a write process.

Figure 3:
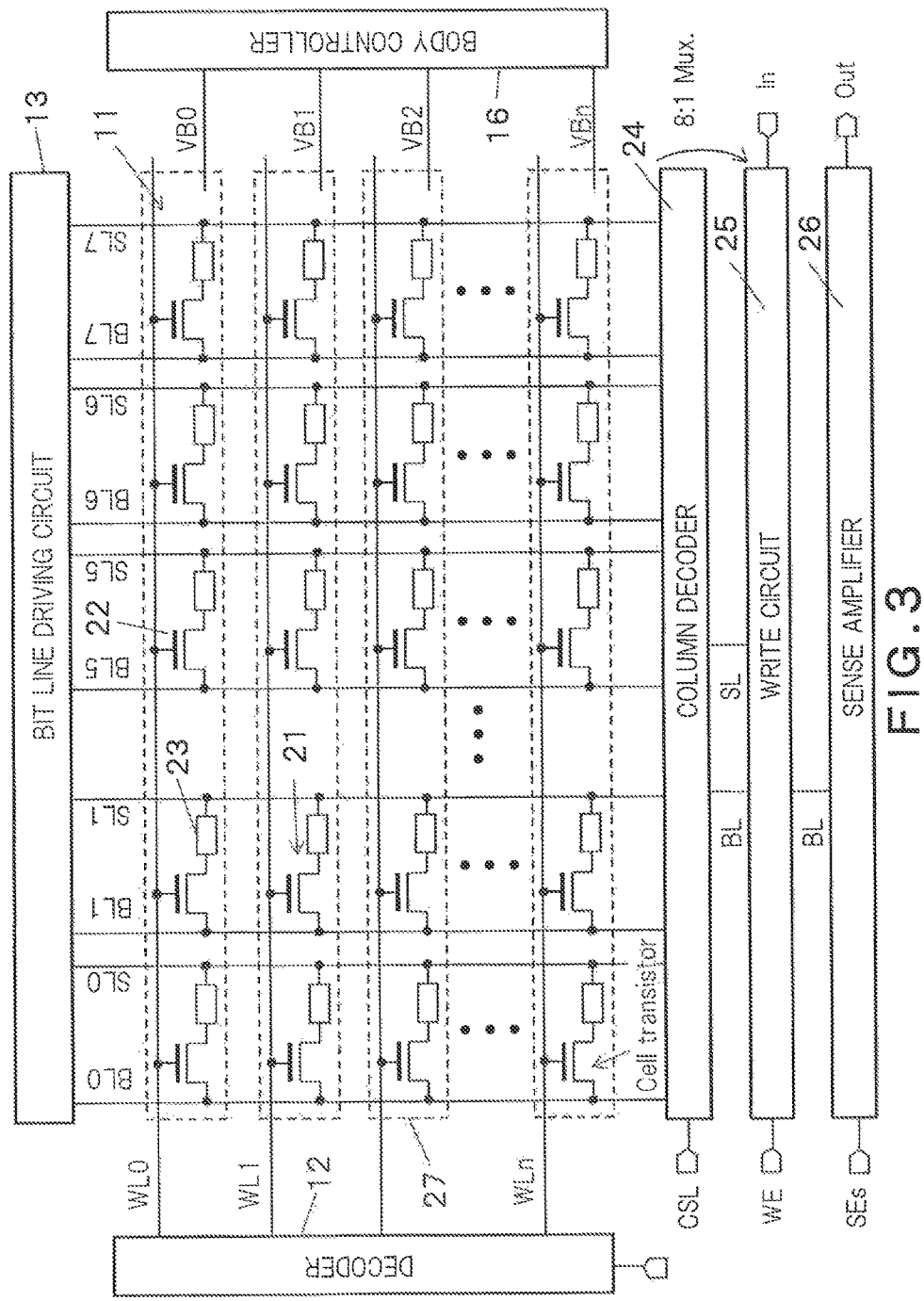
FIG. 3 is a block diagram illustrating the detailed internal structure of the single-level memory 7.

FIG. 3 is a diagram illustrating the detailed internal structure of the single-level memory 7. In FIG. 3, memory cells 21 include cell transistors 22 and magnetoresistive effect elements 23 which are connected in series between bit lines BL0 to BL7 and source lines SL0 to SL7. The bit line driving circuit 13 is connected to one end of each of the plurality of bit lines and a column decoder 24, a write circuit 25, and a sense amplifier 26 forming the write control circuit 14 are connected to the other ends of the plurality of bit lines. In FIG. 3, the read control circuit 15 is not illustrated.

The memory array 11 illustrated in FIG. 3 is divided into a plurality of partial regions 27 represented by a dashed line. The body controller 16 can control the substrate voltage of each partial region 27. Therefore, it is possible to individually control the substrate voltages VB0 to VBn of each partial region 27. In a non-volatile memory such as an MRAM, in general, as the substrate voltage increases, the operating speed of the memory cell 21 increases. The processor 3 can read and write data from and to the memory cell 21 at a high speed.

Therefore, when the substrate voltage of each partial region 27 is individually controlled, the access speeds of the partial regions 27 can be different from each other.

According to this embodiment, it is possible to generate a plurality of memory regions in which the access speeds of the partial regions 27 are different from each other, while using the single-level memory 7. The plurality of memory regions can be used as a plurality of hierarchical cache memories. Specifically, for example, when the memory array 11 has three partial regions 27 and different substrate voltages are applied to the partial regions 27, the three partial regions 27 can be used as L1, L2, and L3 cache memories.

In many cases, an L1 cache memory 10 is provided in the processor 3. In this case, as illustrated in FIG. 4, the single-level memory 7 can be used as a high-order cache memory after the L2 cache memory.

As such, the single-level memory 7 according to this embodiment can be used as an arbitrary level of cache memory according to the hierarchy of a cache memory which is provided other than the single-level memory 7.

Figure 4:
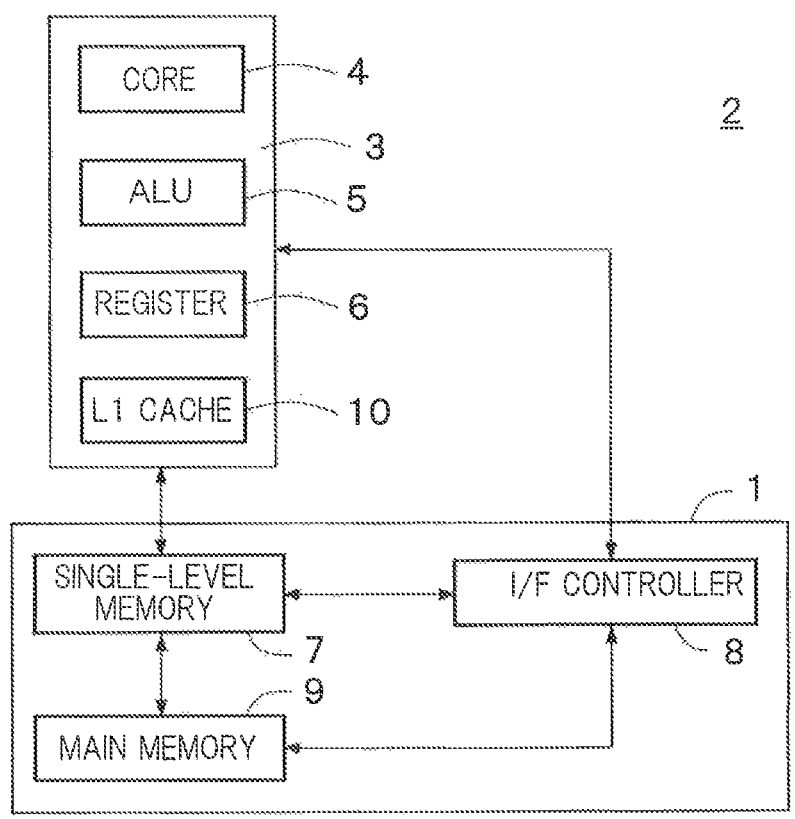
FIG. 4 is a block diagram illustrating an example in which the single-level memory 7 is used as a high-order cache memory.

FIG. 1 or FIG. 4 illustrates an example in which the main memory 9 is provided separately from the single-level memory 7. However, at least a portion of the single-level memory 7 may be used as the main memory 9. In this case, the substrate voltage of each partial region 27 can be changed to achieve one or more levels of cache memories and the main memory 9 using the single-level memory 7.

The plurality of partial regions 27 in the single-level memory 7 do not necessarily have the same size. The plurality of partial regions 27 may have different sizes. In a general hierarchical cache memory, a lower-order cache memory has a smaller memory size and a higher speed. Therefore, the substrate voltage of the partial region 27 with the minimum area may be the maximum and the substrate voltage may be reduced as the area of the partial region 27 increases. In this case, it is possible to construct a hierarchical cache memory in which a lower-order cache memory has a higher speed and a smaller size, using the single-level memory 7. In the present specification, the lower-order cache memory means a cache memory that an access priority of the processor is higher. For example, the L1 cache memory 10 is a lower-order memory than the L2 cache memory. the processor accesses In a case in which the body controller 16 increases the substrate voltage, when the substrate voltage of a predetermined partial region 27 is increased, there is a concern that endurance, such as the number of times data is rewritten to the partial region 27, will be reduced. Therefore, it is not preferable to fix the position where the substrate voltage is increased. For this reason, for example, it is considered that the substrate voltage of the partial region 27 is increased, if necessary. Alternatively, the processor 3 or the I/F controller 8 may perform control such that the partial region 27 of which the substrate voltage is to be increased is not fixed. As a detailed control method, for example, the following method is considered: the number of times the substrate voltage of each partial region 27 is increased is measured for each partial region 27 and control is performed such that the substrate voltage of only a specific partial region 27 is not increased.

(Method for Determining Partial Region 27 of which Access Speed is to be Increased)

The processor 3 or the I/F controller 8 can determine the partial region 27 of which the access speed is to be increased on the basis of various conditions when the access speeds of some of the partial regions 27 in the single-level memory 7 are increased.

(Determination Method 1)

A command issued by the processor 3 tends to sequentially access consecutive address regions. For example, when a given cache line is accessed by a given command, adjacent cache lines are likely to be accessed by the next command. The cache line has a data size of several bytes to several kilobytes. For example, when one cache line is one partial region 27, it is considered that the substrate voltage of the partial region 27 corresponding to a cache line which is adjacent to the cache line accessed by a given command is increased in advance. Alternatively, the substrate voltage of the partial region 27 corresponding to another cache line in which the same bit line as that arranged in one cache line is arranged may be increased in advance.

(Determination Method 2)

When access is continuously performed a plurality of times at a regular address interval, it is expected that the access will be continuously performed at the same address interval. It is considered that the processor 3 or the I/F controller 8 has a function of monitoring an access address interval, the next access address is predicted when the access address interval is constant, and the substrate voltage is increased in advance.

(Determination Method 3)

A management method using software is considered. For example, when the processor 3 repeatedly performs a loop process, it is possible to predict the next access address. Therefore, it is considered that the substrate voltage of the partial region 27 corresponding to the address is increased in advance.

(Determination Method 4)

The following structure is considered: a redundant bit is provided for each partial region 27 or each region smaller than the partial region 27 in the single-level memory 7 and the number of accesses is recorded by the redundant bit; and, when the number of accesses is greater than a predetermined threshold value during a given process, the substrate voltage of the partial region 27 corresponding to the number of accesses is increased in advance.

(Determination Method 5)

In addition to the above-mentioned speculative prediction, the processor 3 or the I/F controller 8 may determine the partial region 27 of which the substrate voltage is to be increased, on the basis of, for example, latency, the endurance of the single-level memory 7, the frequency of access, and an access history.

The latency is the time required for the core 4 to perform access. In general, a region which is closer to the core 4 has lower latency and a higher access speed. Therefore, it is preferable that data having a higher frequency of access be stored in a region which is close to the core 4. Specifically, for example, intermediate data when the core 4 is performing a given process or tag information which is frequently accessed is stored in the region close to the core 4. When the substrate voltage of the region is increased, it is possible to further increase an access speed and thus to improve the processing performance of the processor 3. Therefore, it is considered that the processor 3 or the I/F controller 8 increases the substrate voltage of the partial region 27 with low latency in advance.

As described above, when the substrate voltage of the same region is continuously increased, the endurance of the region is reduced. Therefore, it is considered that the processor 3 or the I/F controller 8 increases the substrate voltage of the partial region 27 to which data is written a small number of times.

In addition, data which is frequently accessed is likely to be accessed again. Therefore, it is considered that the processor 3 or the I/F controller 8 increases the substrate voltage of the partial region 27 including data which is frequently accessed.

It is possible to detect data which has been previously accessed, with reference to least recently used (LRU) information. The previously accessed data is likely to be accessed again. It is considered that the processor 3 or the I/F controller 8 increases the substrate voltage of the partial region 27 including the previously accessed data. Alternatively, a bit indicating the order in which the cache lines have been accessed is given to a tag. When a cache miss occurs, the oldest data of the cache line is ejected to the main memory 9 to empty the cache line and data at a new address which is read from the main memory 9 is stored in the empty cache line. Then, the cache line which has been accessed is updated, regardless of the replacement of the cache line, the other cache lines are moved back by one in the access order, and information indicating the access order is updated. When a cache line which is not frequently accessed is close to the core 4, the substrate voltage of the partial region 27 including the cache line may be increased.

(Method for Increasing Access Speed of Single-Level Memory 7)

The control of the substrate voltage by the body controller 16 is performed independently of access to the single-level memory 7. However, the pre-charge or discharge of the bit line by the bit line driving circuit 13 may be performed independently of access to the single-level memory 7. In a non-volatile memory, such as an MRAM, as the voltage of the bit line increases, a magnetization reversal speed increases and a memory access speed increases. Therefore, similarly to the control of the substrate voltage, the bit lines in some of the partial regions 27 in the single-level memory 7 are pre-charged to improve an access speed to the memory cell 21 in the partial region 27.

Figure 5:
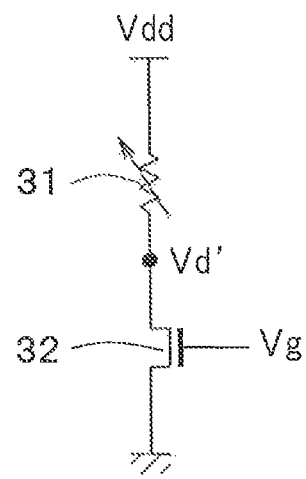
FIG. 5 is an equivalent circuit diagram illustrating an MRAM.

FIG. 5 is an equivalent circuit of an MRAM. In the circuit illustrated in FIG. 5, a magnetic tunnel junction (MTJ) element 31 and a cell transistor 32 are connected in series between a bit line voltage and a source line (grounding wire) voltage, the bit line voltage is Vdd, the gate voltage of the cell transistor 32 is Vg, and a drain voltage is Vd'.

Figure 6:
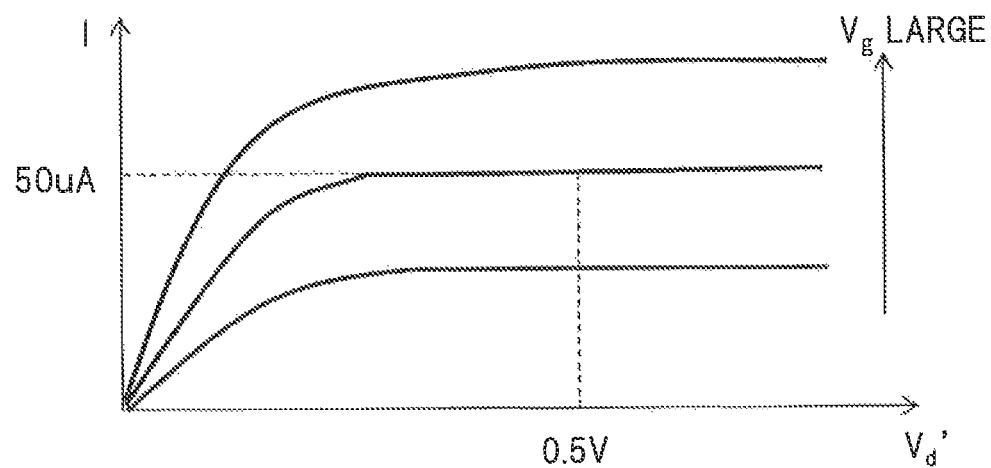
FIG. 6 is a graph illustrating the characteristics of an MTJ element 31.

FIG. 6 is a graph illustrating the characteristics of a current which flows through the MTJ element 31. In FIG. 6, the horizontal axis is the drain voltage Vd' of the cell transistor 32 illustrated in FIG. 5 and the vertical axis is the current which flows through the MTJ element 31. As illustrated in the graph of FIG. 6, as the gate voltage Vg of the cell transistor 32 increases, the amount of current which flows through the MTJ element 31 increases. As the amount of current which flows through the MTJ element 31 increases, the magnetization reversal speed increases.

As a method for improving the magnetization reversal speed, there are the following methods: a method for increasing the bit line voltage Vdd illustrated in FIG. 5; a method for increasing the substrate voltage; and a method for increasing the gate voltage Vg of the cell transistor 32, that is, a word line voltage. These methods may be arbitrarily used in combination with each other.

In general, the voltage of the word line is set during access. Therefore, for the memory cell 21 of which the access speed is desired to be increased, the voltage of the word line during access may be higher than usual. In addition, an increase in the voltage of the bit line during access also contributes to increasing the access speed.

The control of the substrate voltage and the pre-charge voltage of the bit line can also be used to increase the access speed of the partial region 27 which has been speculatively predicted.

(State Transition of Single-Level Memory 7)

Figure 7:
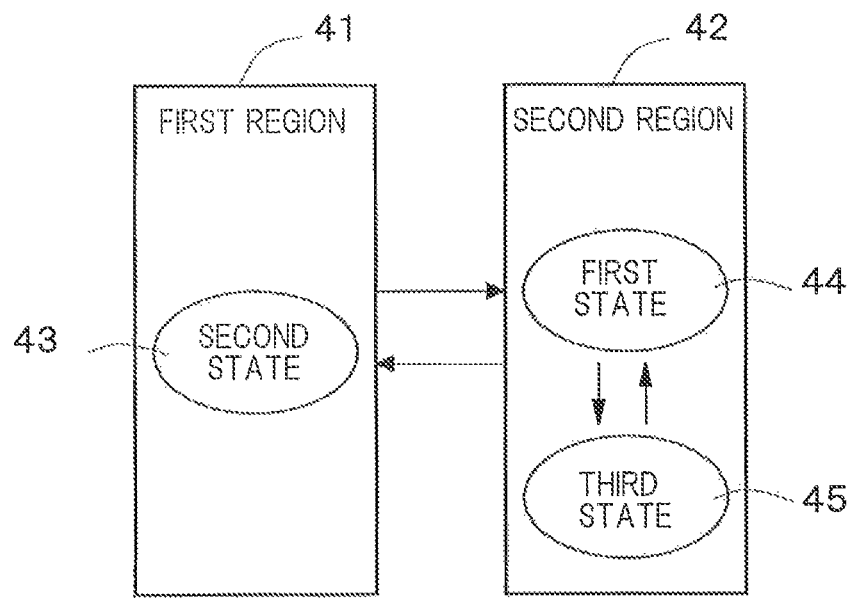
FIG. 7 is a diagram illustrating the state transition of the single-level memory 7 according to this embodiment.

FIG. 7 is a diagram illustrating the state transition of the single-level memory 7 according to this embodiment. The memory region of the single-level memory 7 includes a first region 41 having a high access speed and a second region 42 having a normal access speed. As described above, for example, the substrate voltage is increased to increase the access speed of the first region 41. In FIG. 7, a state in which the access speed is increased is referred to as a second state 43 for convenience of explanation. However, as described above, it is not preferable to increase the substrate voltage of the same partial region 27 for a long time in terms of endurance. Therefore, when a predetermined period of time elapses since an increase in the substrate voltage, the substrate voltage or the bit line voltage may be automatically reduced. Alternatively, the substrate voltage or the bit line voltage may be reduced at the time when the access tendency of the processor 3 changes (for example, when an interrupt occurs or when access to a discontinuous address region starts).

The second region 42 has a first non-selective state 44 which is not accessed by the processor 3 and a third state 45 which is selected first when the processor 3 executes a command. The access speed in the second state 43 of the first region 41 is higher than that in the third state 45. Therefore, the processor 3 can access the first region 41 in the single-level memory 7 at a higher speed than the single-level memory 7 using a general access method.

The pre-charge of the bit line with a voltage is not performed in the first region 41, but may be performed in the first state 44 of the second region 42. That is, when the bit line in the second region 42 is pre-charged in a non-selective state in which the processor 3 does not access the second region 42, it is possible to improve the access speed in the third state 45 to which the memory changes later when the processor 3 performs access. In this case, in the first region 41, only the control of the substrate voltage by the body controller 16 is performed. Therefore, it is possible to increase the access speed of the memory while reducing power consumption in the second state 43 of the first region 41.

In the third state 45 of the second region 42, the switching speed of the cell transistor 32 may be reduced by reverse bias control. For example, the bit line voltage is fixed to a ground level. In this case, an operation speed is reduced, but it is possible to reduce power consumption.

The single-level memory 7 according to this embodiment can be used as a cache memory. Examples of the structure of the cache memory include a full associative structure which can store arbitrary address data in all cache lines, a direct map structure in which the number of storage destinations for each address is limited to one, and a set associative structure which can store arbitrary address data in any of a plurality of cache lines for each address. The single-level memory 7 according to this embodiment may perform cache management using any of the full associative structure, the direct map structure, and the set associative structure.

In some cases, data corresponding to an access request from the processor 3 is not present in the first region 41 of the single-level memory 7. In general, the cache memory includes a tag portion which stores address information in a data cache, in addition to the data cache. An address corresponding to the access request from the processor 3 is searched in the tag portion. It is specified whether or not data corresponding to the access request is stored. When the data is stored, the storage position of the data is specified.

For example, a tag portion is provided in the single-level memory 7. When the tag portion indicates that data corresponding to an access request from the processor 3 is not present in the first region 41, but is present in the second region 42, the second region 42 changes to the third state 45. In the third state 45, the time required for memory access is longer than that in the second state 43. Therefore, process latency occurs in the processor 3. Therefore, in a stage in which the tag portion indicates that data is present in the second region 42, portions in the vicinity of an access destination in the second region 42 may be the first region 41 and the second state 43. In this case, it is difficult to increase the substrate voltage of a new first region 41 in advance. Therefore, for example, the bit line voltage or the word line voltage of the first region 41 may be increased to improve the memory access speed. In this case, even when data corresponding to an access request from the processor 3 is not present in the first region 41, but is present in the second region 42, it is possible to prevent an increase in the process latency of the processor 3.

(Characteristics of Single-Level Memory 7)

Figure 8:
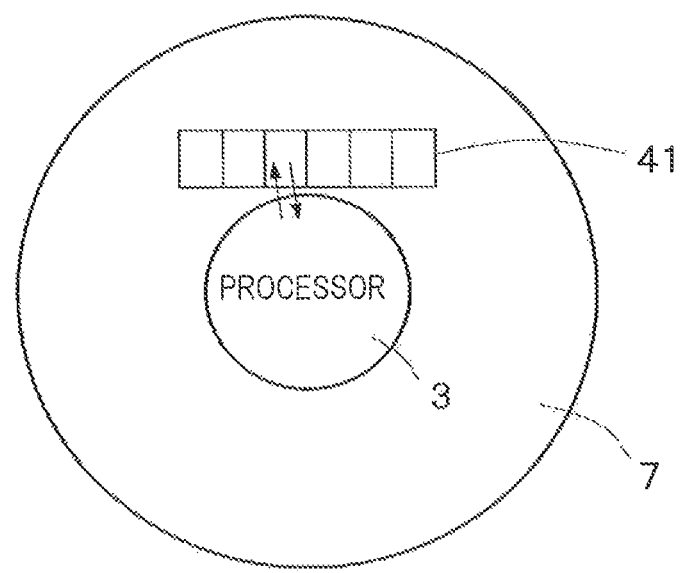
FIG. 8 is a diagram schematically illustrating the arrangement of the single-level memory 7 around the processor 3.

One of the characteristics of the single-level memory 7 according to this embodiment is that the access speed of the single-level memory 7 can be partially and arbitrarily changed depending on the processing status of the processor 3. FIG. 8 is a diagram schematically illustrating the arrangement of the single-level memory 7 in the vicinity of the processor 3. In FIG. 8, for simplicity of illustration, a region in which the processor 3 and the single-level memory 7 are arranged is illustrated in a circular shape. In this embodiment, when the processing load of the processor 3 increases, it is possible to arbitrarily generate the first region 41 with a high access speed in the single level memory 7. As described above, the position where the first region 41 is arranged is speculatively predicted by, for example, the access frequency or access history of the processor 3. The processor 3 can access the first region 41 at a higher speed than the second region 42 other than the first region 41. Therefore, when the address range to be accessed by the processor 3 is set to the first region 41 in advance, it is possible to improve the memory access performance of the processor 3.

In some cases, the address range to be accessed by the processor 3 varies over time. When an access tendency is checked in advance and the first region 41 is moved, it is possible to continuously improve the processing performance of the processor 3.

In a general processor system, data which is frequently accessed by the processor 3 is stored in the L1 cache. However, since the L1 cache has a high speed, but has a limited memory size, a cache miss frequently occurs in the L1 cache, the cache line needs to be frequently replaced. Therefore, in many cases, it is difficult to exhibit the original high-speed performance of the L1 cache. In contrast, in the single-level memory 7 according to this embodiment, it is possible to dynamically increase or decrease the size of the memory region (first region 41) which can be accessed at a high speed, depending on the processing status of the processor 3. Therefore, the problem of a cache miss or the deterioration of the memory access performance due to the replacement of cache lines does not substantially occur. In addition, in general, the L1 cache is an SRAM. The L1 cache has the problem that it has a high operating speed, but has high leakage power and a cell area is large (an occupied area, a chip area, or a footprint is large). In this embodiment, it is possible to improve a partial access speed, using the single-level memory 7 which is a non-volatile memory, if necessary. When the problem of high leakage power is solved, it is possible to reduce the power consumption of the entire memory system 1. In addition, in the MRAM, the cell area can be less than that in the SRAM. When the cell area is small, it is possible to shorten a wiring length, which results in a reduction in wiring delay. Therefore, latency is expected to be reduced.

(Application to Multiple Cores)

Figure 9:
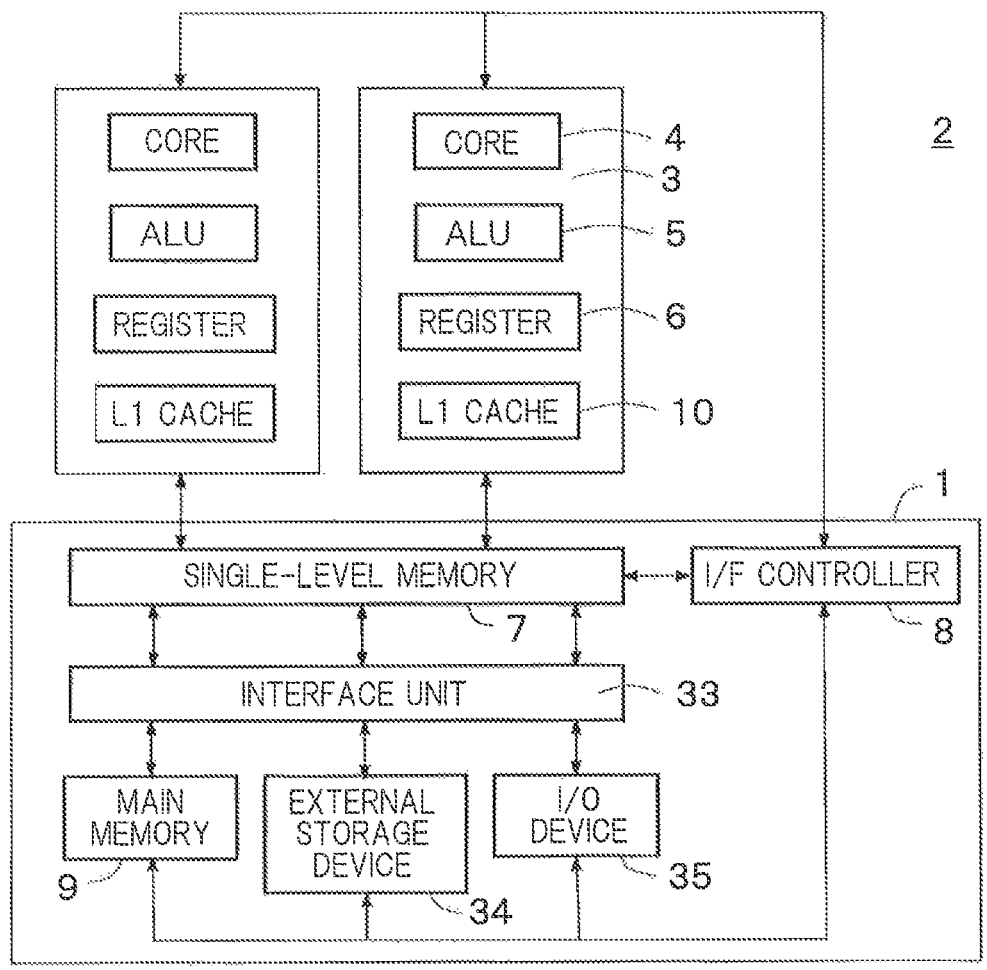
FIG. 9 is a block diagram illustrating a first example of a multi-core processor system 2.

FIG. 1 or FIG. 4 illustrates the structure of the single-core processor system 2. However, this embodiment can also be applied to a multi-core processor system 2. FIG. 9 is a block diagram illustrating a first example of the multi-core processor system 2. FIG. 9 illustrates an example of the processor system 2 in which two processors 3 share one single-level memory 7. However, three or more processor's 3 may share one single-level memory 7. In the example illustrated in FIG. 9, an interface unit 33 is connected to the single-level memory 7. An external storage device 34, such as a solid state disk (SSD), a main memory 9, and various I/O devices 35 are connected to the interface unit 33. The interface unit 33 may be at least one of an internal bus and an external bus or may be a communication interface such as Ethernet (registered trademark) or a universal serial bus (USB).

Each processor 3 illustrated in FIG. 9 includes a core 4 and an L1 cache memory 10. However, each processor 3 may include a high-order cache memory after an L2 cache memory. Inversely, the L1 cache memory 10 may be omitted from each processor 3 and the L1 cache memory 10 may be achieved by the single-level memory 7. In this case, as described above, the substrate voltage of some of the partial regions 27 in the single-level memory 7 can be increased and some partial regions 27 can be used as the L1 cache memory 10.

Figure 10:
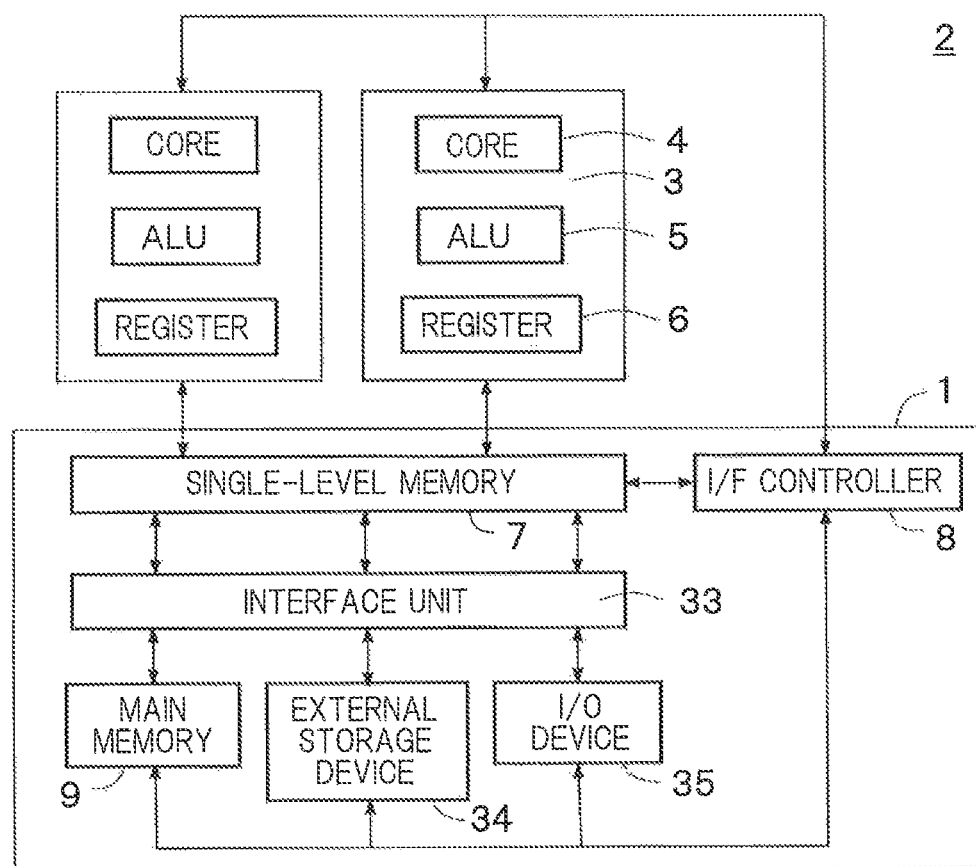
FIG. 10 is a block diagram illustrating a case in which an L1 cache memory 10 is achieved by the single-level memory 7.

FIG. 10 is a block diagram illustrating a case in which the L1 cache memory 10 is achieved by the single-level memory 7. In this case, it is not necessary to provide the L1 cache memory 10 in each processor 3. Therefore, it is possible to simplify a hardware configuration and costs are reduced.

However, in some cases, the L1 cache memory 10 is divided into an L1 data cache for storing data and an L1 command cache for storing commands. In this case, the L2 cache memory is connected to both the L1 data cache and the L1 command cache such that data is transmitted and received therebetween.

Figure 11:
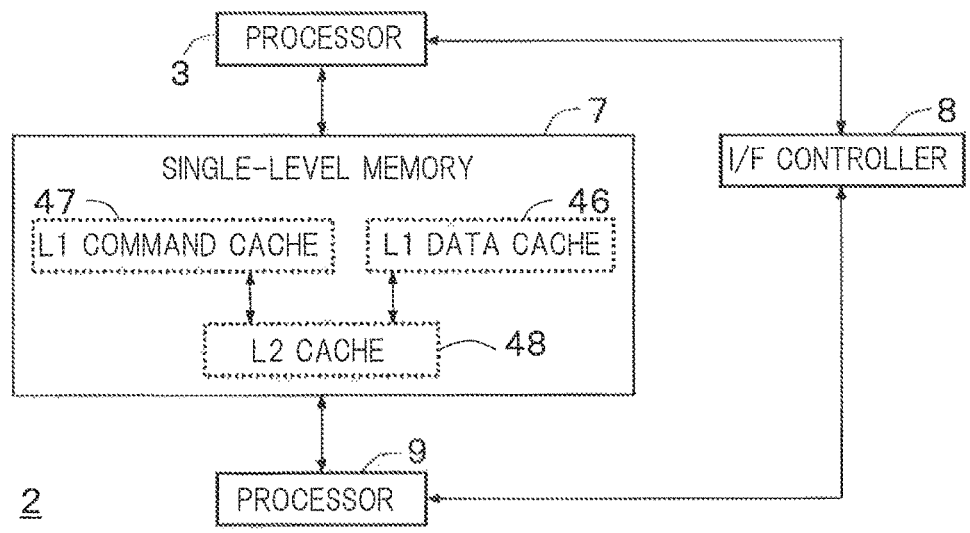
FIG. 11 is a block diagram illustrating an example of a single-core processor system in which an L1 data cache 46, an L1 command cache 47, and an L2 cache memory 48 are achieved by the single-level memory 7.

FIG. 11 is a block diagram illustrating an example of a single-core processor system in which a single-level memory 7 includes an L1 data cache 46, an L1 command cache 47, and an L2 cache memory 48.

Figure 12:
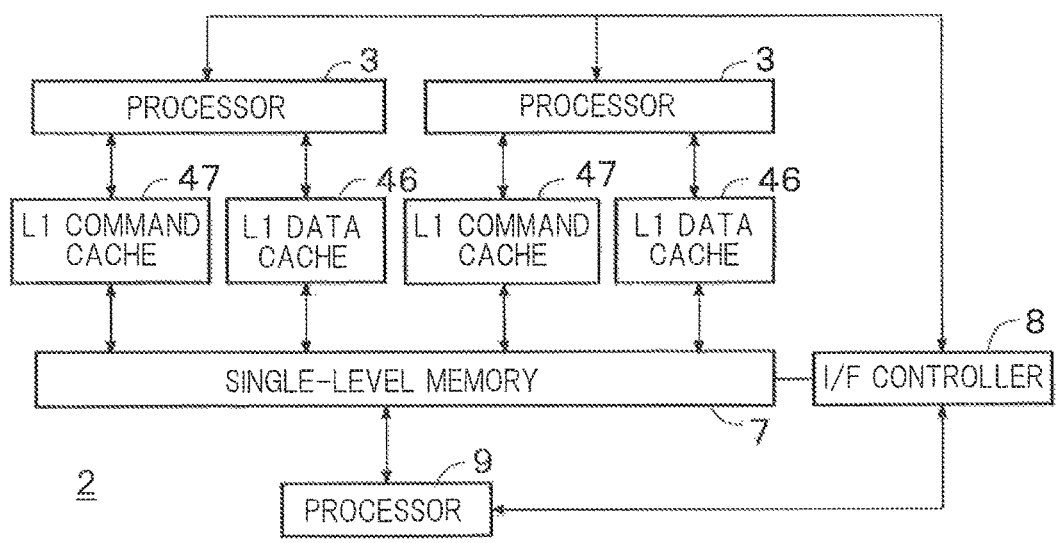
FIG. 12 is a block diagram illustrating a multi-core processor system in which the L1 data cache 46 and the L1 command cache 47 are provided for each processor 3.
Figure 13:
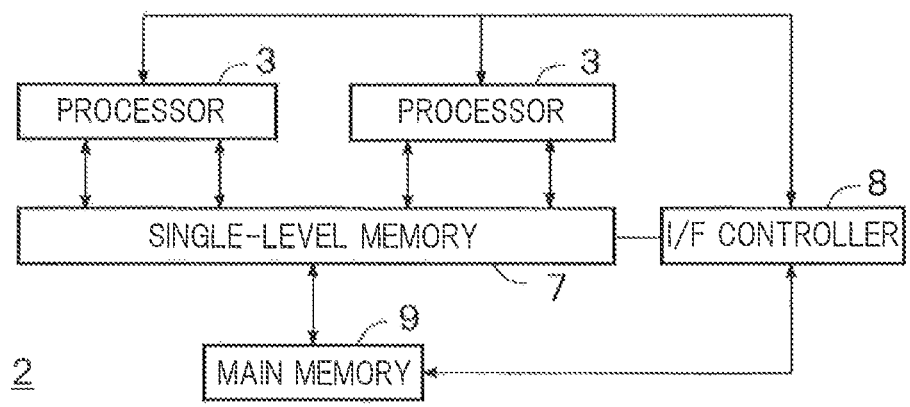
FIG. 13 is a block diagram illustrating an example of a multi-core processor system in which the L1 data cache 46, the L1 command cache 47, and the L2 cache memory 48 are achieved by the single-level memory 7.

FIG. 12 is a block diagram illustrating an example of a multi-core processor system in which an L1 data cache 46 and an L1 command cache 47 are provided for each processor 3, separately from a single-level memory 7. In addition, FIG. 13 is a block diagram illustrating an example of a multi-core processor system in which a single-level memory 7 includes an L1 data cache 46, an L1 command cache 47, and an L2 cache memory 48.

Figure 14:
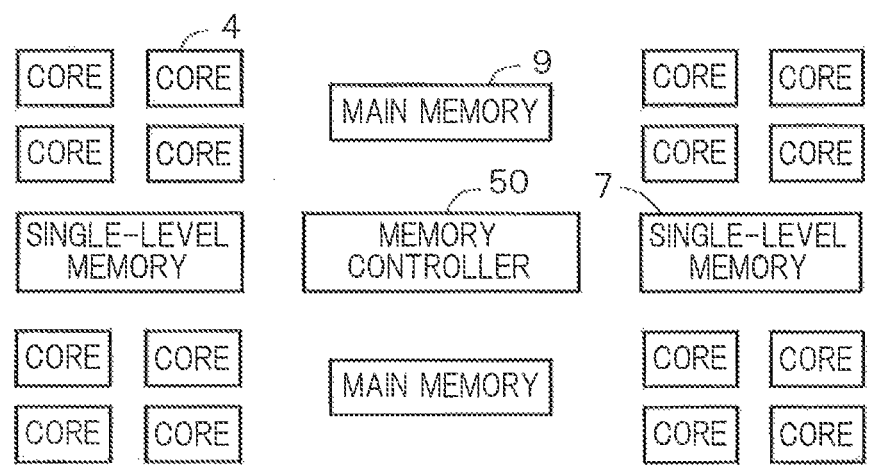
FIG. 14 is a block diagram illustrating an example of a processor system 2 including a plurality of cores 4.

In recent years, a processor 3 has also been proposed in which four or more cores 4 are provided in parallel to improve a processing performance. FIG. 14 is a block diagram illustrating an example of a processor system 2 including a plurality of cores 4. In the processor system 2 illustrated in FIG. 14, all of the cache memories including L1 caches of the plurality of cores 4 are achieved by two single-level memories 7. A memory controller 50 for controlling the single-level memories 7 is provided. The number of single-level memories 7 may increase or decrease depending on the number of cores 4.

Figure 15:
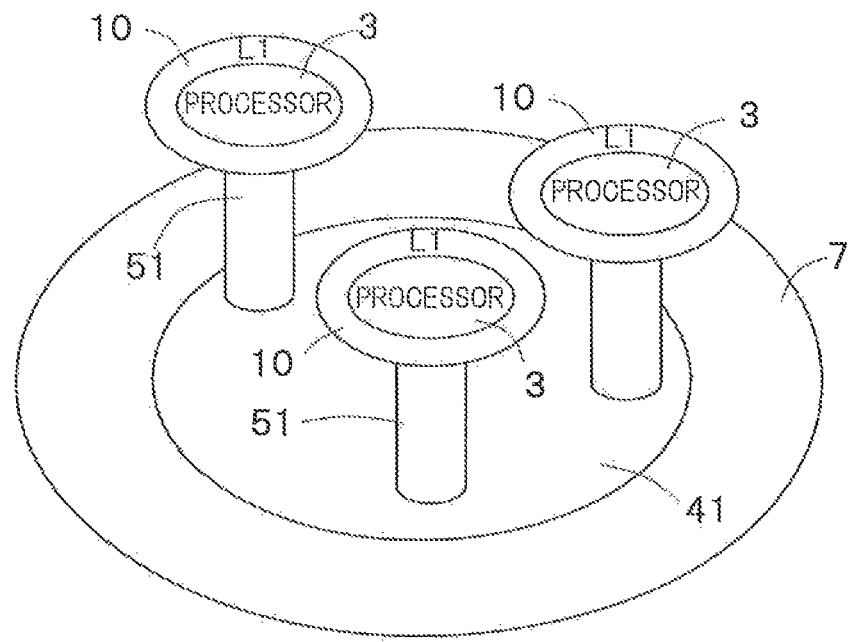
FIG. 15 is a diagram illustrating an example in which a plurality of processors 3 access a common first region 41 in the single-level memory 7.

For example, in the multi-core structure illustrated in FIG. 9, a common first region 41 in the single-level memory 7 may be accessed by a plurality of processors 3. That is, a plurality of processors 3 may share the same first region 41. For example, in some cases, the processing result of data is used for other purposes while the data is processed in parallel. In this case, for example, two processors 3 can process data in parallel and the processing results of the data which are sequentially output can be processed by a processor other than the two processors 3. Even when a plurality of processors 3 share the first region 41, it is possible to make a structure in which latency does not occur in each processor 3. Therefore, the processing performance is improved and it is possible to reduce power consumption. FIG. 15 illustrates an example in which a plurality of processors 3 access a common first region 41 in a single-level memory 7. In this example, the processor 3 is connected to an L1 cache which is the existing SRAM and is connected to the single-level memory 7 according to this embodiment by a contact 51 such as a through silicon via (TSV). FIG. 15 is a conceptual diagram illustrating a simplified structure obtained by extracting only the processor 3 and the single-level memory 7 from the example illustrated in FIG. 9. A plurality of processors 3 may be provided or only one processor 3 may be provided. FIG. 15 illustrates an example in which the processors are connected to the common first region 41 in the single-level memory 7 by the contacts 51 such as TSVs.

Figure 16:
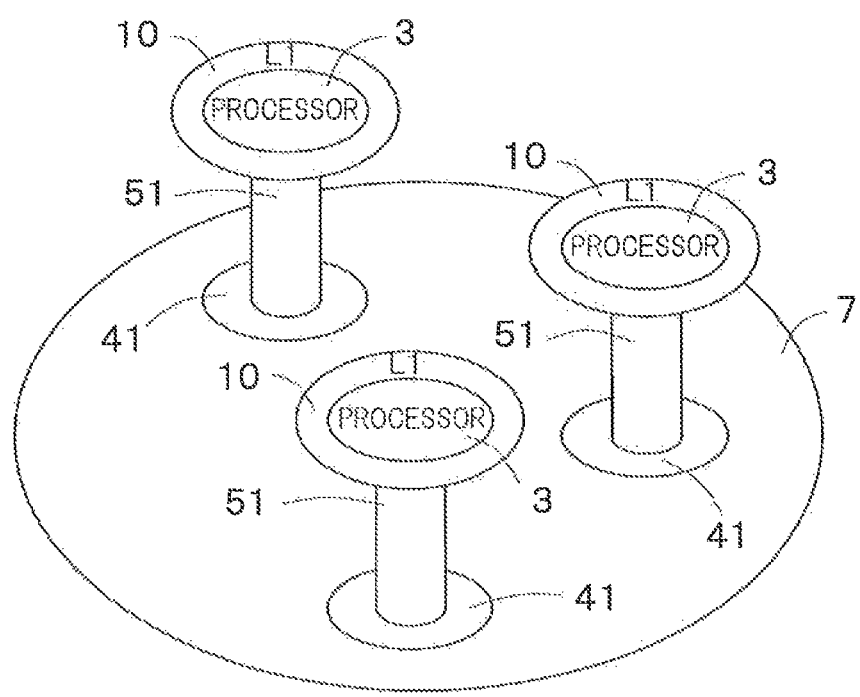
FIG. 16 is a diagram illustrating an example in which each processor 3 accesses individual first regions 41 in the single-level memory.

Alternatively, a plurality of first regions 41 may be provided in the single-level memory 7 and each processor 3 may access the corresponding first region 41. For example, the body controller 16 illustrated in FIG. 3 may increase the substrate voltage of a plurality of partial regions 27 sequentially or in parallel in order to provide a plurality of first regions 41 in the single-level memory 7. When the plurality of first regions 41 are provided in the single-level memory 7, the cores 4 independently perform a process. Therefore, it is possible to further improve the processing performance of multiple cores. FIG. 16 illustrates an example in which processors 3 access individual first regions 41 in a single-level memory.

(Difference in Latency)

The access time of the processor 3 depends on the sum of a read cycle and an access cycle. It is possible to increase the read cycle and the access cycle is determined by the distance from the processor 3. The access cycle is a value equivalent to latency. Here, data may be stored in a place which is suitable for increasing the speed of the single-level memory 7, considering latency.

Figure 17:
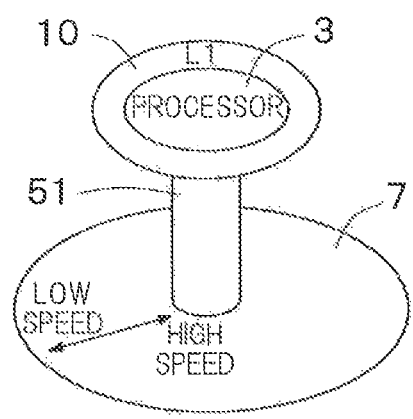
FIG. 17 is a diagram schematically illustrating an example in which the processor 3 and the single-level memory 7 are connected to each other by a contact 51 such as a TSV.

FIG. 17 is a diagram schematically illustrating an example in which the processor 3 and the single-level memory 7 are connected to each other by the contact 51 such as a TSV. FIG. 17 is a conceptual diagram illustrating a simplified structure obtained by extracting only the processor 3 and the single-level memory 7 from the example illustrated in FIG. 9. The processor 3 illustrated in FIG. 17 includes the L1 cache memory 10. In the single-level memory 7, as the distance from the contact 51 connected to the processor 3 is reduced, latency is reduced. It is possible to increase the access speed. Therefore, for example, in the single-level memory 7, data which is frequently accessed may be moved to a place that is as close to the processor 3 as possible. In this case, it is possible to reduce the latency of data that is frequently accessed and thus to increase the access speed of the processor 3.

(First Application Example of Single-Level Memory 7)

The processor system 2 according to this embodiment can be used to increase the processing speed of various information processing programs. For example, a voice recognition program or an image recognition program is given as an example. In the program, for example, the following processes are performed: a feature extraction process which analyzes input data and extracts features required for a process; and a matching process which presumes the content of an input with reference to predetermined criteria or dictionary data, on the basis of the result of the feature extraction process. It is necessary to express extracted features with high-dimensional information in order to increase accuracy. In addition, dictionary data which is used in the matching process needs to include a large amount of information. As a result, the amount of data processed increases. The increase in the amount of data causes a process delay problem. One of the causes of delay is a data reading process. The use of the single-level memory 7 according to this embodiment makes it possible to reduce delay in reading. Hereinafter, a voice recognition program will be described as an example.

First, in the voice recognition program, the extraction result of features is stored in the cache memory. Therefore, it is not necessary to read the extraction result in the matching process which is a subsequent process and the processing speed is improved. However, the amount of features extracted varies depending on the length of a voice section. Therefore, when the amount of data is large or when the cache memory is used for another purpose, there is a problem that data disappears from the cache memory. In the single-level memory 7 according to this embodiment, the extraction result of features is stored in the single-level memory 7 and is read at a high speed if necessary. Therefore, it is possible to prevent delay in data processing.

In addition, a dictionary used for the matching process which presumes the content of the sound produced from the extraction result of voice features is stored in the cache memory. Therefore, it is possible to perform a process at a high speed. However, in the related art, whenever the dictionary is read from the cache memory, it is necessary to refer to data, which results in delay in the read time of data from the cache memory. In this embodiment, the dictionary data is read to the single-level memory 7 in advance. Therefore, it is possible to increase the access speed of a region which is searched before data is referred to. As a result, it is possible to achieve a high-speed search process without any delay in reading.

(Second Application Example of Single-Level Memory 7)

When a plurality of analysis processes are performed for the same data, the use of the single-level memory 7 according to this embodiment is expected to increase the processing speed. For example, a speaker verification process and a voice recognition process can be simultaneously performed for the amount of features extracted from one voice data to achieve a high-performance voice response system. That is, the speaker verification process is performed to specify the user who uses the voice response system and the voice recognition process is performed to comprehend a request from the user. In this way, it is possible to appropriately check the request from the user and to achieve a response process.

For example, a voice response system which searches for a recorded program in response to an input voice and provides the search result to the user can perform the above-mentioned process and output a response "The movie that Mr. or Mrs. A watched yesterday is B" even under search conditions that need to refer to the history of each user such as "What is the title of the movie that I watched yesterday". In order to perform this process at a high speed and with high accuracy, the extraction result of features is stored in the single-level memory 7 and a plurality of processors 3 perform the process in parallel with reference to the same data. In this way, it is possible to achieve a high-performance voice response system without any delay.

(Third Application Example of Single-Level Memory 7)

Figure 18:
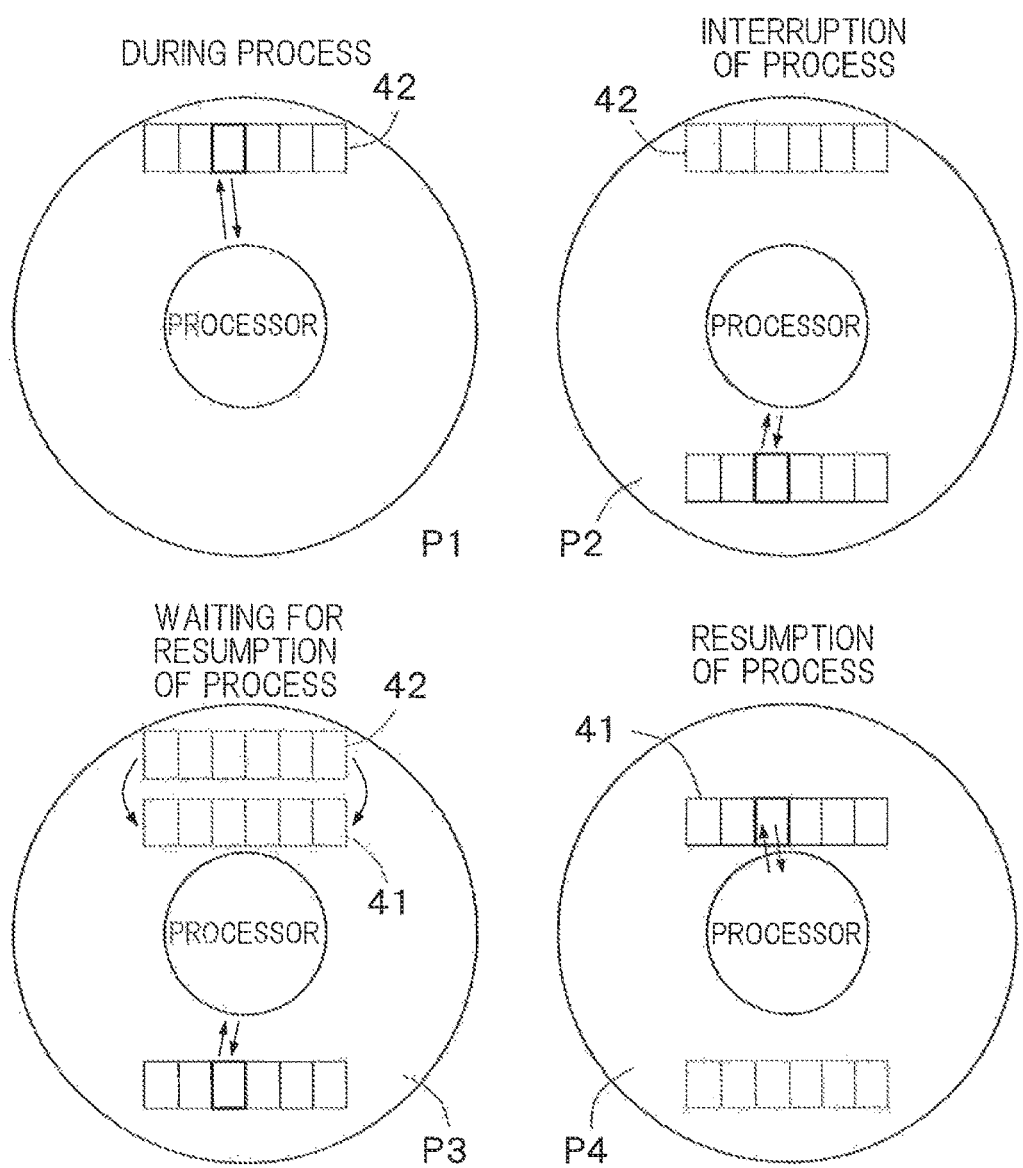
FIG. 18 is a diagram illustrating a third application example of the single-level memory 7.

FIG. 18 is a diagram illustrating a third application example of the single-level memory 7. In a system which executes a plurality of programs, it is necessary to perform a process on the basis of priority. When another request to execute a program B with high priority is issued while the processor 3 is executing a program A using the second region 42 of the single-level memory 7 (p1), the processor 3 interrupts the execution of the program A (p2), retains the second region 42 which stores the processing result in the third state 45, moves data in the second region 42 to the first region 41 which can be accessed at a high speed while the program B is being executed, and changes the second region 42 to the second state 43 (p3). Therefore, when the execution of the program A is resumed after the execution of the program B ends, it is possible to perform a process at a high speed (p4).

A process for changing a state for resuming the execution of a program is performed at the time when another process is expected to end. Therefore, it is possible to resume the process which is interrupted, without any delay. Alternatively, when latency is known in advance, data may be moved to a region with low latency. In addition, data may be moved to a region with low latency during interruption, assuming the resumption of the execution of the program.

For example, when a request to execute another application is issued during the voice recognition process, the state of an operation is temporarily stored and the process is resumed after the application ends. In this way, it is possible to perform the voice recognition process with high efficiency. At the time when an interruption instruction is issued, data may be stored. While a process is being performed, data may be stored as the third state 45 such that the process can be resumed from the head.

Figure 19:
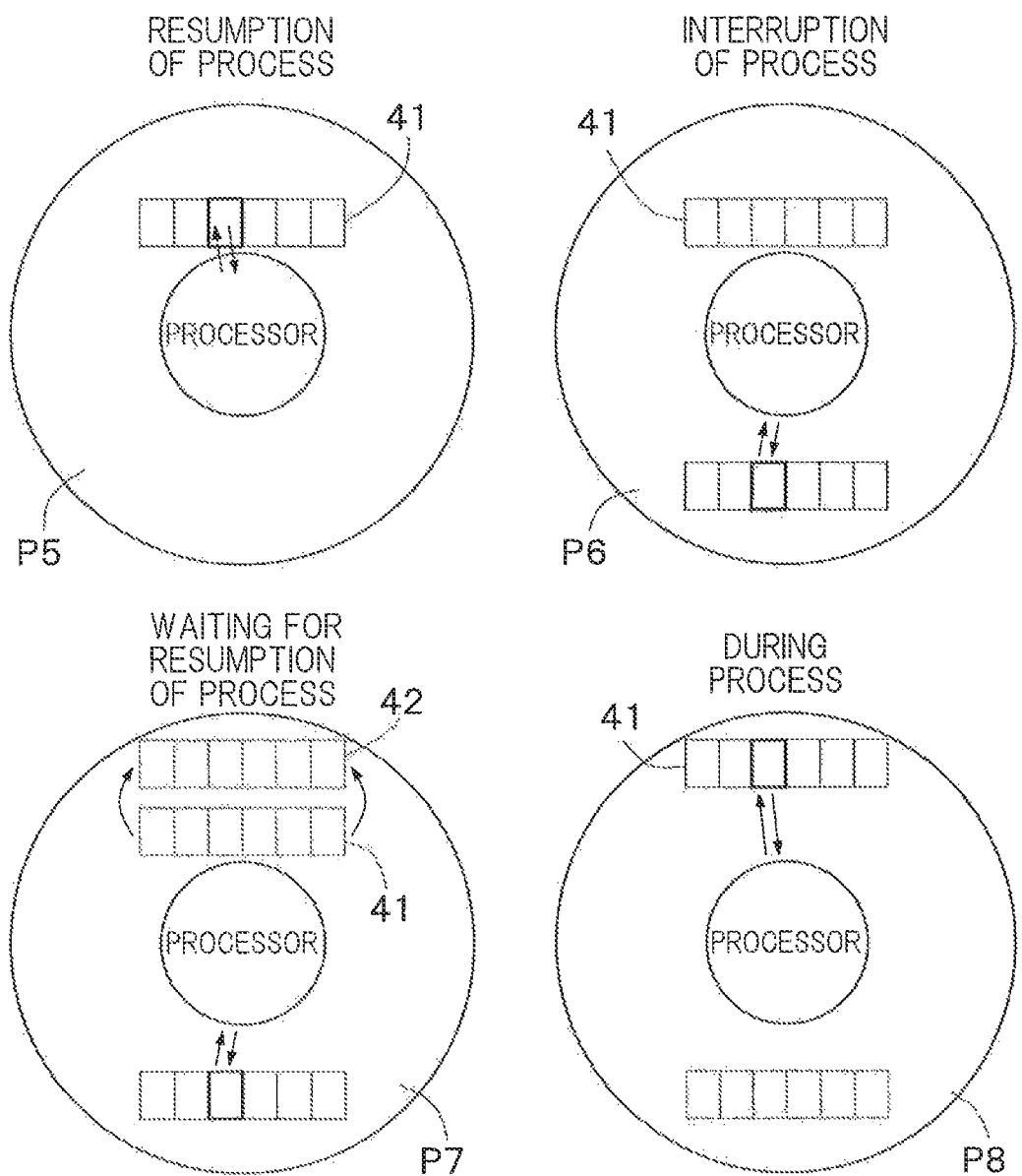
FIG. 19 is a diagram illustrating an example in which a region which is used by an interrupted process in the single-level memory 7 is moved to a position that is farther away from the processor 3.

Contrary to FIG. 18, the region of the single-level memory 7 which has been used by an interrupted process may be moved to a place that is farther away from the processor 3, as illustrated in FIG. 19. In FIG. 19, data for a first process is stored in the first region 41 which can be accessed at a high speed. When a request to interrupt a second process with high priority is input while the processor 3 accesses the first region 41 and performs the first process (p5), the processor 3 interrupts the first process and starts the second process (p6). Then, the processor 3 may move the region used by the first process to the second region 42 such that the first region 41 used by the first process can be used by the second process (p7). Then, when the execution of the second process is completed, the processor 3 accesses the moved second region 42 and continuously performs the first process (p8).

Figure 20:
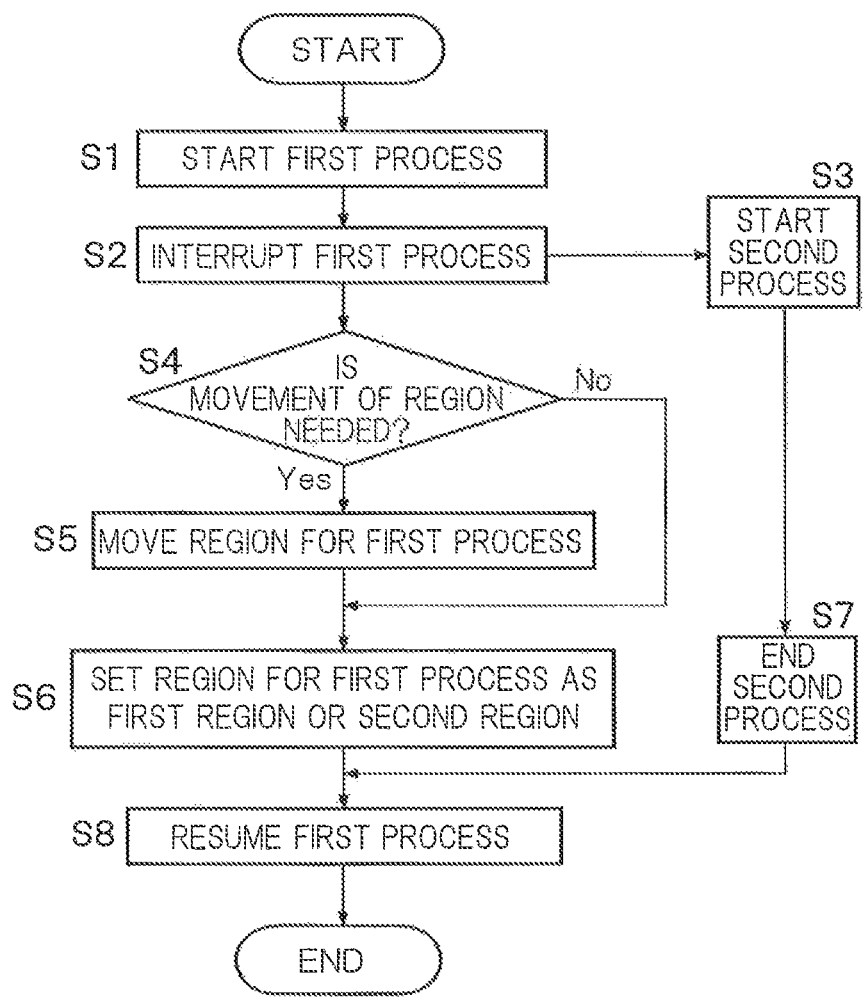
FIG. 20 is a flowchart illustrating the procedure of a process according to the third application example.

FIG. 20 is a flowchart illustrating the procedure of a process in the third application example. First, the processor 3 performs the first process (step S1). When a request to interrupt the second process with high priority is input during the first process, the processor 3 interrupts the first process (step S2) and starts the second process (step S3).

It is determined whether the region of the single-level memory 7 used by the first process needs to be moved (step S4). When the region needs to be moved, the processor moves the region to another position in the single-level memory 7 (step S5). The region may be moved to a position that is closer to the processor 3 as illustrated in FIG. 18 or a position that is farther away from the processor 3 as illustrated in FIG. 19.

Then, the moved region or the original region when the region is not moved is retained as the first region 41 or the second region 42 (step S6). Therefore, the processor is ready to increase, for example, the substrate voltage to increase the access speed of the first region 41. The process for increasing the substrate voltage is not performed for the second region 42.

Then, when the second process ends (step S7), the processor 3 resumes the first process using the first region 41 or the second region 42 (step S8).

A system which executes a plurality of programs needs to perform a process on the basis of priority. When a CPU 2 executes a program B with high priority while a CPU 1 is executing a program A, a large part of the cache region which is used by the CPU 1 is allocated to the CPU 2. Therefore, it is possible to effectively use the cache. In addition, a region with low latency may be preferentially allocated to a program with high priority.

(Fourth Application Example of Single-Level Memory 7)

Figure 21:
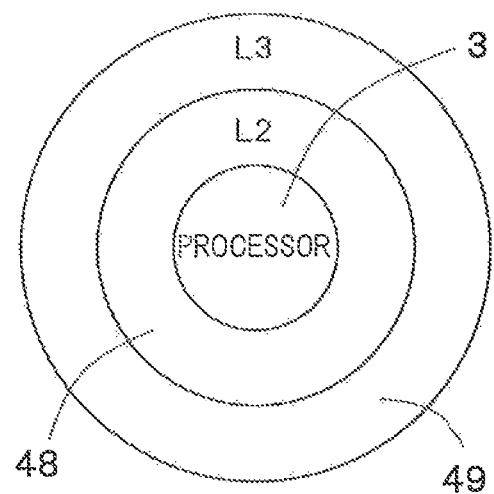
FIG. 21 is a diagram illustrating an example in which cache memories are arranged such that a lower-order cache memory is closer to the processor 3.

When the purpose of the single-level memory 7 is predetermined, a plurality of partial regions 27 which are used as a hierarchical cache memory in the single-level memory 7 may be fixed and used. FIG. 21 is a conceptual diagram illustrating a fourth application example of the single-level memory 7. FIG. 21 illustrates an example in which cache memories are arranged in the single-level memory 7 such that a lower-order cache memory is closer to the processor 3. In FIG. 21, it is assumed that the existing L1 cache memory is provided in the processor 3. A partial region 27 that is closest to the processor 3 is used as an L2 cache memory 48 and a partial region 27 which is the second closest region to the processor 3 is used as an L3 cache memory 49.

In FIG. 21, for example, the substrate voltage of a partial region 27 for the L2 cache memory 48 is higher than the substrate voltage of a partial region 27 for the L3 cache memory 49 and the substrate voltage of a partial region 27 for the L3 cache memory 49 is higher than the substrate voltage of the outer partial regions 27. In addition, the total area of the partial region 27 for the L2 cache memory 48 may be less than the total area of the partial region 27 for the L3 cache memory 39.

In FIG. 21, it is assumed that the substrate voltage of the partial region 27 for the L2 cache memory 48 and the substrate voltage of the partial region 27 for the L3 cache memory 49 are set to fixed voltage levels. However, when the operation of the processor 3 is stopped, it is preferable that the substrate voltages of these partial regions 27 be reduced to prevent a reduction in the endurance of these partial regions 27.

In addition, the structure of at least some levels of cache memories among the hierarchical cache memories which are fixed as illustrated in FIG. 21 may be arbitrarily changed depending on a processing operation of the processor 3.

Figure 22:
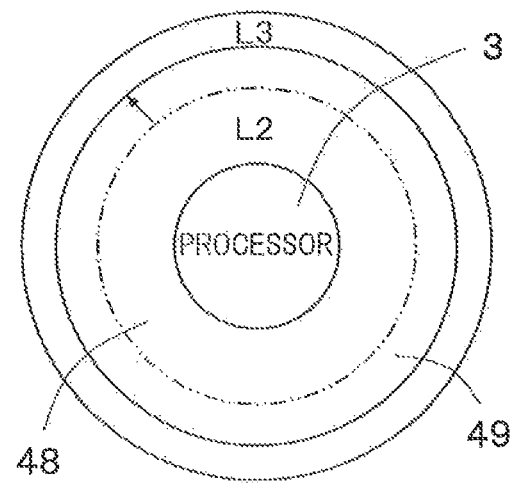
FIG. 22 is a conceptual diagram illustrating an example in which the structure of some hierarchical cache memories is variable.

FIG. 22 is a conceptual diagram illustrating an example in which the structure of some levels of cache memories is changed. FIG. 22 illustrates an example in which, among the hierarchical cache memories illustrated in FIG. 21, the memory size of the L2 cache memory 48 increases and the memory size of the L3 cache memory 49 decreases. For example, the memory size of the L2 cache memory 48 temporarily increases when the amount of calculation of the processor 3 temporarily increases and a memory region which stores the calculation result and can be accessed at a high speed is needed or when it is necessary to search for a large amount of data at a high speed. In this way, it is possible to improve the memory access speed of the processor 3.

(Fifth Application Example of Single-Level Memory 7)

Figure 23:
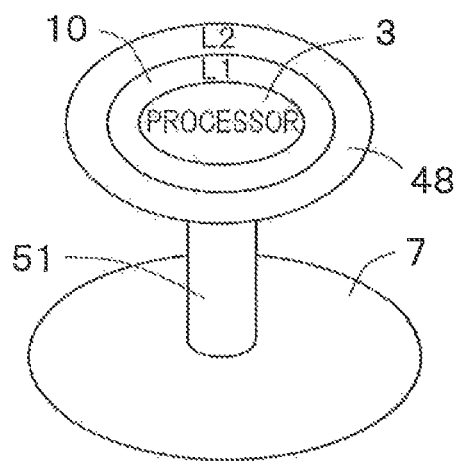
FIG. 23 is a diagram illustrating an example in which a processor 3, an L1 cache memory 10, and an L2 cache memory 48 have the existing structure and are connected to the single-level memory 7 through a contact 51 such as a TSV.

The single-level memory 7 according to this embodiment may be used in combination with the existing cache memory. For example, an SRAM may be used as the L1 cache memory which the processor 3 accesses first at a high speed, similarly to the related art, and high-order cache memories after the L2 cache memory 48 may be achieved by the single-level memory 7 according to this embodiment. As a modification example, an SRAM may be used as the L2 cache memory 48 and high-order cache memories after the L3 cache memory 49 may be achieved by the single-level memory 7 according to this embodiment. In addition, the main memory 9 may be, for example, a DRAM. The main memory 9 may be achieved by the single-level memory 7 according to circumstances. FIG. 23 illustrates an example in which the processor 3, the L1 cache memory 10, and the L2 cache memory 48 have the existing structures and are connected to the single-level memory 7 through the contact 51 such as a TSV. For example, the single-level memory 7 can be used as high-order cache memories after the L3 cache memory 49 or can be used as a work memory for the processor 3. Alternatively, the main memory 9 may be provided separately from the single-level memory 7.

In addition, an SRAM may be used as a tag portion of a certain level of cache memory and a data cache portion may be achieved by the single-level memory 7 according to this embodiment. Alternatively, both the tag portion and the data cache portion may be achieved by the single-level memory 7 according to this embodiment. For example, the substrate voltage of the tag portion may be increased to increase the access speed.

When both the existing cache memory or the main memory 9 and the single-level memory 7 according to this embodiment are used, these memories may be mounted on the same die, or the memories at each level may be arranged on different dies through the contact 51 such as a TSV. In addition, the tag portion and the data cache portion may be arranged on different dies.

Furthermore, the single-level memory 7 according to this embodiment may be provided in addition to the hierarchical cache memory which is, for example, an SRAM and has the same structure as the related art. In a case in which the processor 3 performs a general process under the control of an operating system (OS), when the hierarchical cache memory according to the related art is used to perform a process requiring a large amount of calculation, the single-level memory 7 may also be used to perform the process at a high speed. In this case, the single-level memory 7 may be divided into the first region 41 and the second region 42 or may include only the second region 42. When both the hierarchical cache memory according to the related art and the single-level memory 7 according to this embodiment are used, it is possible to perform a process requiring a lot of time, such as a division process, in parallel, using the single-level memory 7, without postponing the process, and thus to improve the processing speed of the processor 3.

(Examples of Single-Level Memory 7)

1. Example Using STT-MRAM

Figure 24:
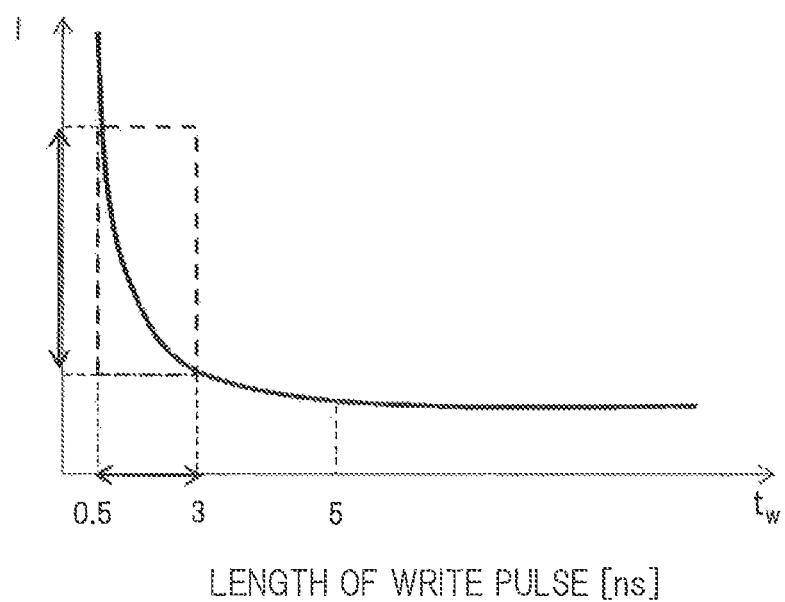
FIG. 24 is a conceptual diagram illustrating a typical operation of an STT-MRAM.

A non-volatile memory is a spin-transfer torque magnetic tunnel junction MRAM (STT-MRAM). It has been known that the magnetization reversal speed varies depending on an operating current in the STT-MRAM. In particular, in a region in which magnetization reversal occurs typically at a pulse width of less than 10 ns and which is called a dynamic region, the reversal time greatly changes depending on a current value. FIG. 24 is a typical operation conceptual diagram illustrating the relationship between the write current and pulse time of the STT-MRAM. For example, in the MTJ element 31 having a diameter of 20 nm, a large magnetization reversal of 30 microamperes (A) occurs at a current with a pulse width of 3 ns. A large magnetization reversal of 50 µA occurs at a current with a pulse width of 2 ns. A large magnetization reversal of 100 µA occurs at a current with a pulse width of 1 ns.

As such, as the pulse width is reduced, the current value required for magnetization reversal increases. In other words, when the current which flows through the MTJ element 31, the magnetization reversal speed changes. Therefore, when a cell which using an MTJ as the non-volatile memory is formed, the write speed of data by the processor 3 changes and the processing performance is improved. As illustrated in FIG. 5, the MTJ element 31 is connected to the source or drain of the cell transistor 32. As described above, the current value which flows through the MTJ element 31 is changed by, for example, a method which changes the bit line voltage Vdd, a method which changes a substrate bias, and a method which changes a gate voltage. For example, when the current which flows through the cell transistor 32 is reduced by half, the gate voltage may be reduced by about 30%. At that time, when the characteristics of the cell transistor 32 are in a saturated region, a target current value can flow through the MTJ element 31 even though the resistance value of the transistor changes due to a change in the gate voltage.

Figure 25:
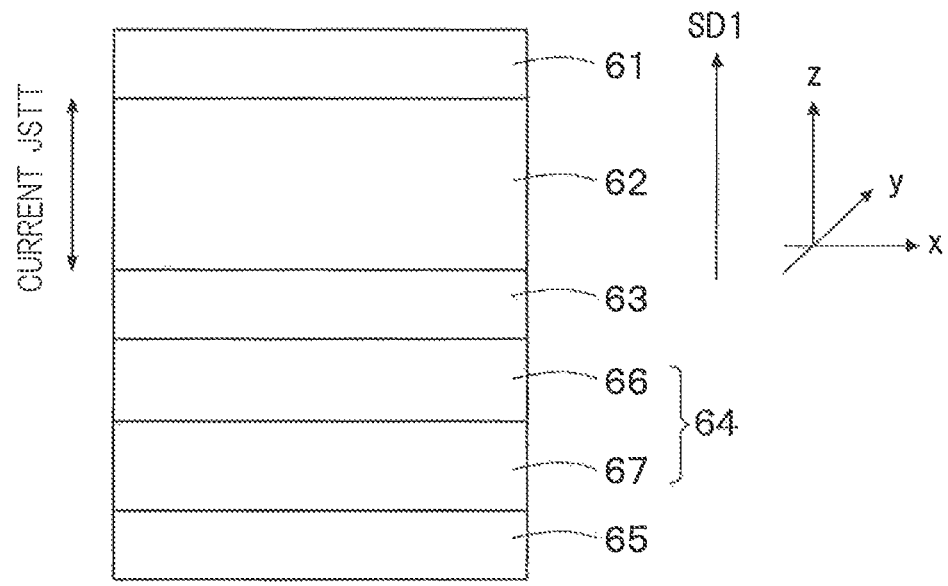
FIG. 25 is a diagram illustrating the cross-sectional structure of the STT-MRAM.

FIG. 25 is a diagram illustrating the cross-sectional structure of the STT-MRAM. As illustrated in FIG. 25, the STT-MRAM has a structure in which a first conductive layer 61, a first ferromagnetic layer 62, a first non-magnetic layer 63, a second ferromagnetic layer 64, and a second conductive layer 65 are laminated in this order. The first ferromagnetic layer 62 is a reference layer having a pinned magnetization direction. The second ferromagnetic layer 64 is a memory layer having a variable magnetization direction. The first non-magnetic layer 63 (spacer layer) is provided between the first ferromagnetic layer 62 and the second ferromagnetic layer 64.

The first ferromagnetic layer 62 or the second ferromagnetic layer 64 is directly or indirectly connected to the first conductive layer 61. In addition, the first ferromagnetic layer 62 or the second ferromagnetic layer 64 is directly or indirectly connected to the second conductive layer 65.

Hereinafter, a laminate of the first conductive layer 61, the first ferromagnetic layer 62, the first non-magnetic layer 63, the second ferromagnetic layer 64, and the second conductive layer 65 is referred to as a laminate SB1. The thickness of the first ferromagnetic layer 62 is in the range of 0.5 nm to 15 nm and is typically in the range of 2 nm to 10 nm. The thickness of the second ferromagnetic layer 64 is in the range of 0.5 nm to 10 nm and is typically in the range of 0.8 nm to 3 nm.

The first ferromagnetic layer 62 and the second ferromagnetic layer 64 can be made of a metal material including at least one element which is selected from a group consisting of, for example, iron (Fe), cobalt (Co), nickel (Ni), manganese (Mn), and chromium (Cr). In addition, the first ferromagnetic layer 62 and the second ferromagnetic layer 64 may be made of an alloy including the at least one element selected from the group and at least one metal which is selected from a group consisting of platinum (Pt), palladium (Pd), iridium (Ir), ruthenium (Ru), rhodium (Rh), gallium (Ga), and germanium (Ge).

For example, the composition of magnetic materials included in the first ferromagnetic layer 62 and the second ferromagnetic layer 64 or heat treatment conditions are adjusted. In this way, it is possible to adjust characteristics, such as the amount of magnetization and magnetic anisotropy, in the first ferromagnetic layer 62 and the second ferromagnetic layer 64. For example, a first portion 66 and a second portion 67 can be formed in the second ferromagnetic layer 64. The first ferromagnetic layer 62 and the second ferromagnetic layer 64 can be made of a rare-earth-transition metal amorphous alloy, such as TbFeCo or GdFeCo. The first ferromagnetic layer 62 and the second ferromagnetic layer 64 may have a laminated structure, such as Co/Pt, Co/Pd, or Co/Ni. For example, Co/Ru, Fe/Au, or Ni/Cu is combined with a base layer to form a perpendicular magnetization film. The crystal orientation direction of a film is controlled to use, for example, Co/Ru, Fe/Au, or Ni/Cu as the first ferromagnetic layer 62 and the second ferromagnetic layer 64. The first ferromagnetic layer 62 and the second ferromagnetic layer 64 may include additives, such as aluminum (Al), germanium (Ge), nitrogen (N), phosphor (P), arsenic (As), boron (B), and silicon (Si).

At least one of the first portion 66 and the second portion 67 may be made of, for example, a Heusler alloy. The Heusler alloy has, for example, an $L2_1$ structure and has various compositions of $X_2YZ$. In this case, at least one of the first portion 66 and the second portion 67 includes the Heusler alloy including, for example, at least one of Co, Mn, Fe, Ni, Cu, Rh, Ru, and Pd.

For example, the first portion 66 and the second portion 67 include a first Heusler alloy. The first Heusler alloy includes at least one of $Co_2FeSi$, $Co_2FeAl$, $Co_2FeGa$, $Co_2MnGe$, $Co_2MnSn$, $Co_2MnSi$, $Co_2MnGa$, $Co_2MnAl$, $Co_2MnSb$, $Co_2CrGa$, $Ni_2MnIn$, $Ni_2MnGa$, $Ni_2MnSn$, $Ni_2MnSb$, $Ni_2FeGa$, $Pd_2MnSb$, $Pd_2MnSn$, $Cu_2MnAl$, $Cu_2MnSn$, $Cu_2MnIn$, $Rh_2MnGe$, $Rh_2MnPb$, $Rh_2MnSn$, $Pd_2MnGe$, $Rh_2FeSn$, $Ru_2FeSn$, and $Rh_2FeSb$.

When the second portion 67 is made of the first Heusler alloy, it is possible to increase, for example, the saturation magnetization Ms of the second portion 67.

For example, the first portion 66 and the second portion 67 may include a second Heusler alloy. The second Heusler alloy includes at least one of $Co_2HfSn$, $Co_2ZrSn$, $Co_2HfAl$, $Co_2ZrAl$, $Co_2HfGa$, $Co_2TiSi$, $Co_2TiGe$, $Co_2TiSn$, $Co_2TiGa$, $Co_2TiAl$, $Co_2VGa$, $Co_2VAl$, $Co_2TaAl$, $Co_2NbGa$, $Co_2NbAl$, $Co_2VSn$, $Co_2NbSn$, $Co_2CrAl$, $Rh_2NiSn$, $Rh_2NiGe$, $Mn_2WSn$, $Fe_2MnSi$, and $Fe_2MnAl$.

The second Heusler alloy used for the first portion 66 has a relatively small saturation magnetization Ms. For example, the saturation magnetization Ms can be less than 400 emu/cc. In this case, for example, it is possible to reduce magnetic field leakage to adjacent magnetic memory elements.

In this embodiment, the first portion 66 or the second portion 67 may be made of the above-mentioned Heusler alloy or both the first portion 66 and the second portion 67 may be made of the above-mentioned Heusler alloy. It is preferable that the first portion 66 be made of the second Heusler alloy. In this case, for example, it is possible to prevent magnetic field leakage to neighboring elements. It is preferable that the second portion 67 be made of the first Heusler alloy.

The first non-magnetic layer 63 can be made of, for example, an insulating material which functions as a non-magnetic tunnel barrier layer. Specifically, for example, the first non-magnetic layer 63 can be made of an oxide, a nitride, or a fluoride including at least one element which is selected from a group consisting of aluminum (Al), titanium (Ti), zinc (Zn), zirconium (Zr), tantalum (Ta), cobalt (Co), nickel (Ni), silicon (Si), magnesium (Mg), and iron (Fe). The non-magnetic tunnel barrier layer is a non-magnetic layer which includes, for example, an insulator and in which a current (tunnel current) flows due to a tunnel effect when a voltage is applied. The thickness of the non-magnetic tunnel barrier layer is, for example, equal to or less than 2 nm. Therefore, when a voltage is applied, a tunnel current flows through the non-magnetic tunnel barrier layer.

The first non-magnetic layer 63 can be made of, for example, $Al_2O_3$, $SiO_2$, MgO, AlN, Ta—O, Al—Zr—O, $Bi_2O_3$, $MgF_2$, $CaF_2$, $SrTiO_3$, $AlLaO_3$, Al—N—O, or Si—N—O. The first non-magnetic layer 63 can be made of, for example, a non-magnetic semiconductor (ZnOx, InMn, GaN, GaAs, TiOx, Zn, Te, or materials obtained by doping these materials with transition metal).

It is preferable that the thickness of the first non-magnetic layer 63 be equal to or greater than about 0.2 nanometers (nm) and equal to or less than about 2.0 nm. In this case, for example, it is possible to prevent resistance from being excessively high while ensuring the uniformity of an insulating film.

The first conductive layer 61 and the second conductive layer 65 are made of, for example, a conductive magnetic material or a conductive non-magnetic material. The conductive magnetic material can be, for example, magnetic metal including at least one element which is selected from a group consisting of iron (Fe), cobalt (Co), nickel (Ni), manganese (Mn), and chromium (Cr). In addition, the first conductive layer 61 and the second conductive layer 65 may be made of an alloy including the at least one element selected from the group and at least one element which is selected from a group consisting of platinum (Pt), palladium (Pd), iridium (Ir), ruthenium (Ru), and rhodium (Rh).

The conductive non-magnetic material used for the first conductive layer 61 and the second conductive layer 65 can be, for example, any metal selected from a group consisting of gold (Au), copper (Cu), chromium (Cr), zinc (Zn), gallium (Ga), niobium (Nb), molybdenum (Mo), ruthenium (Ru), palladium (Pd), silver (Ag), hafnium (Hf), tantalum (Ta), titanium (Ti), tungsten (W), platinum (Pt), bismuth (Bi), and aluminum (Al), or an alloy including two or more metals selected from the group.

The conductive non-magnetic material used for the first conductive layer 61 and the second conductive layer 65 may be at least one of a conductive nitride, a conductive oxide, and a conductive fluoride including at least one element selected from the above-mentioned group. The conductive non-magnetic material used for the first conductive layer 61 and the second conductive layer 65 may be, for example, a carbon nanotube, a carbon nanowire, or a graphene.

Conductive protective films may be provided on the first conductive layer 61 and the second conductive layer 65. In this case, the protective film can be made of a material, such as an alloy including at least one element which is selected from a group consisting of tantalum (Ta), ruthenium (Ru), copper (Cu), copper (Cu), gold (Au), silver (Ag), and aluminum (Al) or graphene. It is preferable that the protective film be made of any element which is selected from a group consisting of copper (Cu) and aluminum (Al) or an alloy including the elements, considering electromigration and low resistance.

In some cases, a transistor is directly or indirectly connected to at least one of the first conductive layer 61 and the second conductive layer 65. In this case, for example, the source or drain of the transistor may be used as at least one of the first conductive layer 61 and the second conductive layer 65. In addition, in this case, for example, a contact portion which is connected to the source or drain of the transistor may be used as at least one of the first conductive layer 61 and the second conductive layer 65.

It is assumed that a direction which is parallel to a lamination direction SD1 of the laminate SB1 is the Z-axis direction. It is assumed that an axis which is perpendicular to the Z-axis is the X-axis. It is assumed that an axis which is perpendicular to the X-axis and the Z-axis is the Y-axis. The surfaces of the layers included in the laminate SB1 are parallel to the X-Y plane. For example, a main surface 10a is parallel to the X-Y plane.

In the MTJ element 31, a current flows to the laminate SB1 in the lamination direction SD1 to apply spin-polarized electrons to the second ferromagnetic layer 64. Then, the magnetization direction of the first portion 66 and the magnetization direction of the second portion 67 in the second ferromagnetic layer 64 are determined according to the direction of the current.

<Perpendicular Magnetization MTJ>

The first ferromagnetic layer 62 functions as, for example, a first magnetization pinned layer. In the first ferromagnetic layer 62, for example, magnetization is pinned in a substantially vertical direction with respect to the surface of the layer. The magnetization direction of the first ferromagnetic layer 62 is substantially parallel to the lamination direction SD1.

The second ferromagnetic layer 64 functions as, for example, a magnetic memory layer. When the second ferromagnetic layer 64 includes a first portion and a second portion, for example, the magnetization direction of the first portion 66 is substantially perpendicular to the surface of the layer and is substantially parallel to the lamination direction SD1. The first portion is arranged close to the first non-magnetic layer 63. The magnetization of the first portion 66 can be reversed. The first portion 66 has a function of improving spin injection efficiency during magnetization reversal. The second portion is arranged close to the second conductive layer 65.

In the second portion 67 of the second ferromagnetic layer 64, for example, the magnetization direction of the second portion 67 is substantially perpendicular to the surface of the layer and is substantially parallel to the lamination direction SD1. The magnetization of the second portion 67 can be reversed. The second portion has a function of storing data.

<In-Plane Magnetization MTJ>

The first ferromagnetic layer 62 functions as, for example, a first magnetization pinned layer. In the first ferromagnetic layer 62, for example, magnetization is pinned in a direction that is substantially parallel to the surface of the layer. The magnetization direction of the first ferromagnetic layer 62 is substantially perpendicular to the lamination direction SD1.

The second ferromagnetic layer 64 functions as, for example, a magnetic memory layer. In addition, when the second ferromagnetic layer 64 includes a first portion and a second portion, for example, the magnetization direction of the first portion 66 is substantially parallel to the surface of the layer and is substantially perpendicular to the lamination direction SD1. The first portion is arranged close to the first non-magnetic layer 63. The magnetization of the first portion 66 can be reversed. The first portion 66 has a function of improving spin injection efficiency during magnetization reversal. The second portion is arranged close to the second conductive layer 65.

In the second portion 67 of the second ferromagnetic layer 64, for example, the direction of magnetization of the second portion 67 is substantially parallel to the surface of the layer and is substantially perpendicular to the lamination direction SD1. The magnetization of the second portion 67 can be reversed. The second portion has a function of storing data.

<Cross-Sectional Shape of MTJ>

The shape of the laminate SB1 is arbitrary when the laminate SB1 is projected onto the X-Y plane. When the laminate SB1 is projected onto the X-Y plane, the shape of the laminate SB1 is, for example, a circle, an ellipse, a flat circle, or a polygon. When the shape of the laminate SB1 is a polygon, it is preferable that the polygon have three or more angles. That is, the polygon is preferably a rectangle or a hexagon. In addition, the polygon may have rounded corners.

When the laminate SB1 is projected onto a plane (for example, the Z-X plane or the Z-Y plane) parallel to the Z-axis, the shape of the laminate SB1 is arbitrary. When the laminate SB1 is projected onto the plane parallel to the Z-axis, the shape of the laminate SB1 (a cross-sectional shape perpendicular to the surface of the layer) can be, for example, a tapered shape or an inverse tapered shape.

<Magnetic Shield>

At least a portion of a side surface SS1 of the laminate SB1 may be covered with a magnetic shield. In other words, the magnetic shield faces at least a portion of the side surface of the laminate SB1. The shape of the magnetic shield which is projected onto the X-Y plane is, for example, an annular shape surrounding the laminate SB1.

The magnetic memory element further includes a protective layer which is provided between the side surface of the laminate SB1 and the magnetic shield. It is preferable that the thickness of the protective layer be, for example, equal to or greater than 2 nm and equal to or less than 30 nm.

For example, the side surface of the laminate SB1 is covered with the magnetic shield, such as permalloy (Py), with a protective layer made of, for example, SiN or $Al_2O_3$ interposed therebetween. Therefore, for example, when a plurality of magnetic memory elements are arranged in a line, it is possible to prevent the magnetic field which leaks from adjacent magnetic memory elements from having an adverse effect on the operation of the laminate SB1. For example, in each memory cell (laminate SB1), the effective magnetic field applied to the laminate SB1 is substantially the same. Therefore, a variation in inversion current between bits is suppressed. In addition, it is possible to prevent the magnetic field which leaks from the laminate SB1 from being applied to adjacent magnetic memory elements. As a result, it is possible to arrange a plurality of magnetic memory elements so as to be close to each other and thus to improve the degree of integration. For example, it is possible to improve the memory density of a non-volatile memory device.

The magnetic shield is made of, for example, any metal selected from a group consisting of iron (Fe), cobalt (Co), nickel (Ni), manganese (Mn), and chromium (Cr), or an alloy including two or more metals selected from the group. The magnetic shield may be made of, for example, an alloy including at least one metal which is selected from a group consisting of iron (Fe), cobalt (Co), nickel (Ni), manganese (Mn), and chromium (Cr) and at least one metal which is selected from a group consisting of platinum (Pt), palladium (Pd), iridium (Ir), ruthenium (Ru), rhodium (Rh), gallium (Ga), and germanium (Ge).

The composition of the magnetic material included in the magnetic shield or heat treatment conditions are adjusted to adjust the characteristics of the magnetic shield. The magnetic shield may be made of, for example, a rare-earth-transition metal amorphous alloy such as TbFeCo or GdFeCo. In addition, the magnetic shield may have a laminated structure such as Co/Pt, Co/Pd, and Co/Ni.

The protective layer can be made of, for example, an oxide, a nitride, or a fluoride including at least one element which is selected from a group consisting of aluminum (Al), titanium (Ti), zinc (Zn), zirconium (Zr), tantalum (Ta), cobalt (Co), nickel (Ni), silicon (Si), magnesium (Mg), and iron (Fe). The protective layer is made of, for example, SiN.

2. Example Using SOT-MRAM

Figure 26:
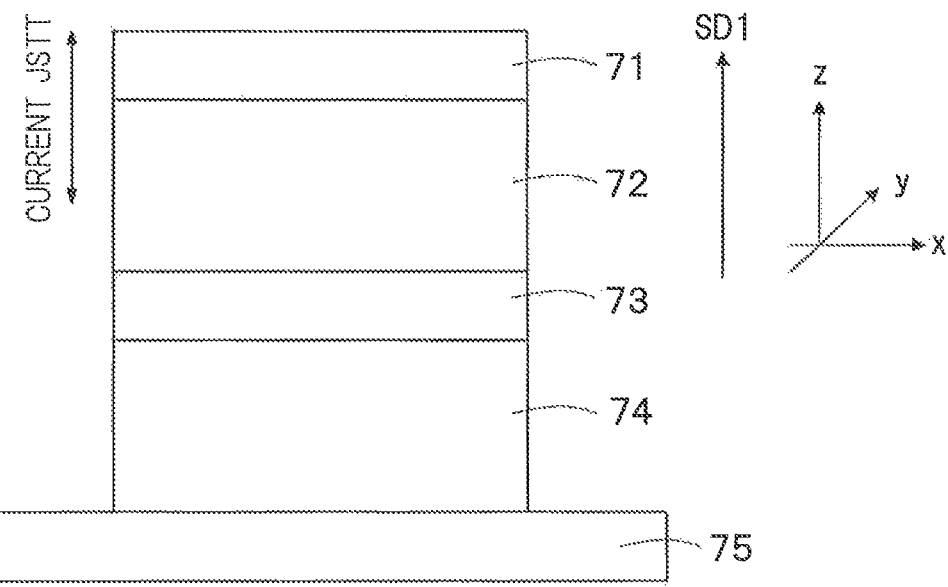
FIG. 26 is a diagram illustrating the cross-sectional structure of a SOT-MRAM.

The non-volatile memory forming the single-level memory 7 may be a spin-orbit torque magnetic tunnel junction MRAM (SOT-MRAM). FIG. 26 is a diagram illustrating the cross-sectional structure of the SOT-MRAM. As illustrated in FIG. 26, the SOT-MRAM has a structure in which a first conductive layer 71, a first ferromagnetic layer 72, a first non-magnetic layer 73, a second ferromagnetic layer 74, and a second conductive layer 75 are laminated in this order.

The first ferromagnetic layer 72 is a reference layer having a pinned magnetization direction. The second ferromagnetic layer 74 is a memory layer having a variable magnetization direction. The first non-magnetic layer 73 (spacer layer) is provided between the first ferromagnetic layer 72 and the second ferromagnetic layer 74.

The first ferromagnetic layer 72 and the first conductive layer 71 are directly or indirectly connected to each other. In addition, the second ferromagnetic layer 74 and the second conductive layer 75 are directly or indirectly connected to each other. A laminate of the first conductive layer 71, the first ferromagnetic layer 72, the first non-magnetic layer 73, the second ferromagnetic layer 74, and the second conductive layer 75 is referred to as a laminate SB1.

The second conductive layer 75 is made of a material with a strong spin orbit interaction, which will be described below. When a current ($J_{SOT}$) flows, a spin orbit field Hso is generated. The spin orbit field may also be called a spin orbit torque Tso which acts on the magnetization of the second ferromagnetic layer 74. The use of the spin orbit field makes it possible to directly reverse the magnetization direction of the second ferromagnetic layer 74. In addition, a current ($J_{STT}$) may flow to reverse the magnetization direction of the second ferromagnetic layer 74 while the current ($J_{SOT}$) flows to apply the spin orbit field Hso to the second ferromagnetic layer 74. In any case, the amount of current ($J_{SOT}$) is changed to control the time required to reverse the magnetization of the second ferromagnetic layer 74. For example, a certain current ($J_{STT}$) flows to change the magnetization direction of the second ferromagnetic layer 74 at a time of 0.5 ns or less. In addition, the current ($J_{STT}$) which is more than the current ($J_{STT}$) flows to change the magnetization direction of the second ferromagnetic layer 74 at a time of 0.2 ns or less. As such, as a pulse width is reduced, a current value required for magnetization reversal increases.

The thickness of the first ferromagnetic layer 72 is in the range of 0.5 nm to 15 nm and is typically in the range of 2 nm to 10 nm. The thickness of the second ferromagnetic layer 74 is in the range of 0.1 nm to 5 nm and is preferably equal to or less than 2 nm.

The first ferromagnetic layer 72 and the second ferromagnetic layer 74 can be made of, for example, a metal material including at least one element which is selected from a group consisting of iron (Fe), cobalt (Co), nickel (Ni), manganese (Mn), and chromium (Cr). In addition, the first ferromagnetic layer 72 and the second ferromagnetic layer 74 may be made of an alloy including the at least one element selected from the group and at least one metal which is selected from a group consisting of platinum (Pt), palladium (Pd), iridium (Ir), ruthenium (Ru), rhodium (Rh), gallium (Ga), and germanium (Ge).

For example, the composition of the magnetic materials included in the first ferromagnetic layer 72 and the second ferromagnetic layer 74 or heat treatment conditions are adjusted. In this way, it is possible to adjust characteristics, such as the amount of magnetization and magnetic anisotropy, in the first ferromagnetic layer 72 and the second ferromagnetic layer 74. The second ferromagnetic layer 74 may be divided into a first portion and a second portion, for example. The first ferromagnetic layer 72 and the second ferromagnetic layer 74 can be made of a rare-earth-transition metal amorphous alloy, such as TbFeCo or GdFeCo. The first ferromagnetic layer 72 and the second ferromagnetic layer 74 may have a laminated structure of, for example, Co/Pt, Co/Pd, or Co/Ni. For example, Co/Ru, Fe/Au, or Ni/Cu is combined with a base layer to form a perpendicular magnetization film. The crystal orientation direction of a film is controlled to use, for example, Co/Ru, Fe/Au, or Ni/Cu as the first ferromagnetic layer 72 and the second ferromagnetic layer 74. The first ferromagnetic layer 72 and the second ferromagnetic layer 74 may include additives, such as aluminum (Al), germanium (Ge), nitrogen (N), phosphor (P), arsenic (As), boron (B), and silicon (Si).

The first ferromagnetic layer 72 and the second ferromagnetic layer 74 may be made of, for example, a Heusler alloy. The Heusler alloy has, for example, an $L2_1$ structure and has various compositions of $X_2YZ$. In this case, at least one of a first portion 76 and a second portion 77 includes the Heusler alloy including, for example, at least one of Co, Mn, Fe, Ni, Cu, Rh, Ru, and Pd.

For example, the first ferromagnetic layer 72 and the second ferromagnetic layer 74 include, for example, a first Heusler alloy. The first Heusler alloy includes at least one of $Co_2FeSi$, $Co_2FeAl$, $Co_2FeGa$, $Co_2MnGe$, $Co_2MnSn$, $Co_2MnSi$, $Co_2MnGa$, $Co_2MnAl$, $Co_2MnSb$, $Co_2CrGa$, $Ni_2MnIn$, $Ni_2MnGa$, $Ni_2MnSn$, $Ni_2MnSb$, $Ni_2FeGa$, $Pd_2MnSb$, $Pd_2MnSn$, $Cu_2MnAl$, $Cu_2MnSn$, $Cu_2MnIn$, $Rh_2MnGe$, $Rh_2MnPb$, $Rh_2MnSn$, $Pd_2MnGe$, $Rh_2FeSn$, $Ru_2FeSn$, and $Rh_2FeSb$.

The use of the first Heusler alloy makes it possible to increase, for example, the saturation magnetization Ms of the second portion 77.

The first ferromagnetic layer 72 and the second ferromagnetic layer 74 include, for example, a second Heusler alloy. The second Heusler alloy includes at least one of $Co_2HfSn$, $Co_2ZrSn$, $Co_2HfAl$, $Co_2ZrAl$, $Co_2HfGa$, $Co_2TiSi$, $Co_2TiGe$, $Co_2TiSn$, $Co_2TiGa$, $Co_2TiAl$, $Co_2VGa$, $Co_2VAl$, $Co_2TaAl$, $Co_2NbGa$, $Co_2NbAl$, $Co_2VSn$, $Co_2NbSn$, $Co_2CrAl$, $Rh_2NiSn$, $Rh_2NiGe$, $Mn_2WSn$, $Fe_2MnSi$, and $Fe_2MnAl$.

The second Heusler alloy has a relatively small saturation magnetization Ms. For example, the saturation magnetization Ms can be less than 400 emu/cc. In this case, for example, it is possible to reduce magnetic field leakage to adjacent magnetic memory elements.

In this embodiment, the first ferromagnetic layer 72 or the second ferromagnetic layer 74 may be made of the Heusler alloy or both the first ferromagnetic layer 72 and the second ferromagnetic layer 74 may be made of the Heusler alloy. It is preferable that the second ferromagnetic layer 74 be made of the second Heusler alloy. In this case, for example, it is possible to prevent the magnetic field from leaking to neighboring elements. It is preferable that the second portion 77 be made of the first Heusler alloy.

The first nonmagnetic layer 73 is made of, for example, an insulating material which functions as a non-magnetic tunnel barrier layer. Specifically, for example, the first non-magnetic layer 73 can be made of an oxide, a nitride, or a fluoride including at least one element which is selected from a group consisting of aluminum (Al), titanium (Ti), zinc (Zn), zirconium (Zr), tantalum (Ta), cobalt (Co), nickel (Ni), silicon (Si), magnesium (Mg), and iron (Fe). The non-magnetic tunnel barrier layer is a non-magnetic layer which includes, for example, an insulator and in which a current (tunnel current) flows due to a tunnel effect when a voltage is applied. The thickness of the non-magnetic tunnel barrier layer is, for example, equal to or less than 2 nm. Therefore, when a voltage is applied, a tunnel current flows through the non-magnetic tunnel barrier layer.

The first non-magnetic layer 73 can be made of, for example, $Al_2O_3$, $SiO_2$, MgO, AlN, Ta—O, Al—Zr—O, $Bi_2O_3$, $MgF_2$, $CaF_2$, $SrTiO_3$, $AlLaO_3$, Al—N—O, or Si—N—O. The first non-magnetic layer 73 can be made of, for example, a non-magnetic semiconductor (ZnOx, InMn, GaN, GaAs, TiOx, Zn, Te, or materials obtained by doping these materials with transition metal).

It is preferable that the thickness of the first non-magnetic layer 73 be equal to or greater than about 0.2 nanometers (nm) and equal to or less than about 2.0 nm. In this case, for example, it is possible to prevent resistance from being excessively high while ensuring the uniformity of an insulating film.

The first conductive layer 71 is made of, for example, a conductive magnetic material or a conductive non-magnetic material. The conductive magnetic material can be, for example, magnetic metal including at least one element which is selected from a group consisting of iron (Fe), cobalt (Co), nickel (Ni), manganese (Mn), and chromium (Cr). In addition, the first conductive layer 71 may be made of an alloy including the at least one element selected from the group and at least one element which is selected from a group consisting of platinum (Pt), palladium (Pd), iridium (Ir), ruthenium (Ru), and rhodium (Rh).

The conductive non-magnetic material used for the first conductive layer 71 can be, for example, any metal selected from a group consisting of gold (Au), copper (Cu), chromium (Cr), zinc (Zn), gallium (Ga), niobium (Nb), molybdenum (Mo), ruthenium (Ru), palladium (Pd), silver (Ag), hafnium (Hf), tantalum (Ta), titanium (Ti), tungsten (W), platinum (Pt), bismuth (Bi), and aluminum (Al), or an alloy including two or more metals selected from the group.

The conductive non-magnetic material used for the first conductive layer 71 may be at least one of a conductive nitride, a conductive oxide, and a conductive fluoride including at least one element selected from the above-mentioned group. The conductive non-magnetic material used for the first conductive layer 71 may be, for example, a carbon nanotube, a carbon nanowire, or a graphene.

The second conductive layer 75 has a strong spin orbit interaction which can be used to switch the magnetic moment of the second ferromagnetic layer 74 (memory layer). The second conductive layer 75 can be used to generate a spin orbit field Hso. The spin orbit field can also be called a spin orbit torque Tso which acts on the magnetization of the second ferromagnetic layer 74. In this embodiment, the second conductive layer 75 is made of a material with a strong spin orbit interaction. In this material, the spin orbit interaction includes both a spin Hall effect and a Rashba effect and one of the two effects is dominant. The spin Hall effect and the Rashba effect will be described below. The spin Hall effect is generally regarded as a bulk effect. In some cases, materials which exhibit the spin Hall effect include a heavy metal or materials doped with a heavy metal. For example, the material can be selected from M doped with A and B. Here, A includes Y, Zr, Nb, Mo, Tc, Ru, Rh, Pd, Cd, In, Sb, Te, Hf, Ta (including high-resistance amorphous β-Ta), W, Re, Os, Ir, Pt, Au, Hg, Ti, Pb, Bi, Po, At, and/or combinations thereof. In addition, M includes at least one of Al, Ti, V, Cr, Mn, Cu, Zn, Ag, Hf, Ta, W, Re, Pt, Au, Hg, Pb, Si, Ga, GaMn, and GaAs. Furthermore, B includes at least one of V, Cr, Mn, Fe, Co, Ni, P, S, Zn, Ga, Ge, As, Se, Y, Zr, Nb, Mo, Tc, Ru, Rh, Pd, Ag, Cd, InSb, Te, I, Lu, Hf, Ta, W, Re, Os, Ir, Pt, Au, Hg, Ti, Pb, Bi, Po, At, La, Ce, Pr, Nd, Pm, Sm, Eu, Gd, Tb, Dy, Ho, Er, Tm, and Yb. For example, Ta, Pd, Cd, Cu, Au, Bi, Ir, Ru, and W may be used without any change. For example, the material is Cu doped with Ir and/or Cu doped with Bi or can include them.

In another material with a strong pin orbit interaction, the generation of the spin orbit field Hso is related to spin orbit interaction at the interface. A strong spin orbit effect at the interface is related to the gradient of the crystal field in a direction perpendicular to an interface direction and is generally called a Rashba effect. In this embodiment, the spin orbit effect is not limited thereto. The Rashba effect means a spin orbit interaction at the interface. In at least a predetermined embodiment, an interface for the second conductive layer 75 needs to be different from other interfaces in order to obtain a very high Rashba effect. For example, when a Pt film, a Co film, and a MgO film are used as the second conductive layer 75, the second ferromagnetic layer 74, and the first non-magnetic layer 73, respectively, it is possible to obtain the Rashba effect. The second conductive layer 75 may be made of an alloy. For example, the material forming the second conductive layer 75 can include at least one of Cu, Zn, Ga, Ge, As, Se, Y, Zr, Nb, Mo, Tc, Ru, Rh, Pd, Ag, Cd, In, Sn, Sb, Te, I, Lu, Hf, Ta, W, Re, Os, Ir, Pt, Au, Hg, Ti, Pb, Bi, Po, At, La, Ce, Pr, Nd, Pm, Sm, Eu, Gd, Tb, Dy, Ho, Er, Tm, Yb, and/or combinations thereof. In another embodiment, the second conductive layer 75 includes a surface alloy of A and B (for example, A atoms arranged in the (111) plane of B which is a main material) and an upper atomic layer is a mixture of A and B. Here, A includes at least one of Cu, Zn, Ga, Ge, As, Se, Y, Zr, Nb, Mo, Tc, Ru, Rh, Pd, Ag, Cd, In, Sn, Sb, Te, I, Lu, Hf, Ta, W, Re, Os, Ir, Pt, Au, Hg, Ti, Pb, Bi, Po, At, La, Ce, Pr, Nd, Pm, Sm, Eu, Gd, Tb, Dy, Ho, Er, Tm, and Yb and B includes at least one of Si, Zn, Cu, Ag, Au, W, Zn, Cr, Pt, and Pd. In many embodiments, A includes two or three different materials.

The thickness of the second conductive layer 75 is in the range of 0.5 nm to 100 nm and is typically in the range of 0.5 nm to 10 nm. The thickness of the second conductive layer 75 is preferably equal to or less than 5 nm.

Conductive protective films may be provided on the first conductive layer 71 and the second conductive layer 75. In this case, the protective film can be made of a material, such as an alloy including at least one element which is selected from a group consisting of tantalum (Ta), ruthenium (Ru), copper (Cu), copper (Cu), gold (Au), silver (Ag), and aluminum (Al) or graphene. It is preferable that the protective film be made of any element which is selected from a group consisting of copper (Cu) and aluminum (Al) or an alloy including the elements, considering electromigration and low resistance.

The second conductive layer 75 is made of a material with a strong spin orbit interaction, which will be described below. When a current ($J_{SOT}$) flows, a spin orbit field Hso is generated. The spin orbit field can also be called a spin orbit torque Tso which acts on the magnetization of the second ferromagnetic layer 74. The use of the spin orbit field makes it possible to directly reverse the magnetization direction of the second ferromagnetic layer 74. In addition, a current ($J_{STT}$) may flow to reverse the magnetization direction of the second ferromagnetic layer 74 while the current ($J_{SOT}$) flows to apply the spin orbit field Hso to the second ferromagnetic layer 74. In any case, the amount of current ($J_{SOT}$) changes to change the time required to reverse the magnetization of the second ferromagnetic layer 74. For example, when $J_{STT}$ is 0, a certain current ($J_{SOT}$) flows to change the magnetization direction of the second ferromagnetic layer 74 at a time of 0.5 ns or less. In addition, a current ($J_{SOT}$) which is more than the current flows to change the magnetization direction of the second ferromagnetic layer 74 at a time of 0.2 ns or less. As another example, when $J_{SOT}$ is given as a finite value, a certain current ($J_{STT}$) flows to change the magnetization direction of the second ferromagnetic layer 74 at a time of 0.5 ns or less. In addition, a current ($J_{STT}$) which is more than the current flows to change the magnetization direction of the second ferromagnetic layer 74 at a time of 0.2 ns or less. As such, as a pulse width is reduced, a current value required for magnetization reversal increases.

The thickness of the first ferromagnetic layer 72 is in the range of 0.5 nm to 15 nm and is typically in the range of 2 nm to 10 nm. The thickness of the second ferromagnetic layer 74 is in the range of 0.1 nm to 5 nm and is preferably equal to or less than 3 nm.

The thickness of the second conductive layer 75 is in the range of 0.5 nm to 100 nm and is typically in the range of 0.5 nm to 10 nm. The thickness of the second conductive layer 75 is preferably equal to or less than 5 nm.

As the thickness of the second conductive layer 75 is reduced, the amount of current required to reverse the magnetization of the second ferromagnetic layer 74 can increase, which is preferable.

A structure in which the first ferromagnetic layer 72 and the second ferromagnetic layer 74 are vertically magnetized is suitable for reducing a size. As a result, it is possible to improve the degree of integration of the memory array 11. In this case, since a wiring length is reduced, an access cycle is reduced and the processing performance is improved. A reduction in the processing time makes it possible to return the mode to the L3 mode or to lengthen the time for which the supply of power is cut in, for example, power gating. Therefore, it is possible to reduce power consumption.

The magnetic field may be applied from the outside. It is preferable that the magnetic field be applied in a direction in which a main component is in the xy plane. For example, the magnetic field is an in-plane magnetic field.

When the first ferromagnetic layer 72 and the second ferromagnetic layer 74 are magnetized in the plane, the cross-sectional shape of the MTJ may be flat. In this case, it is easy to maintain an in-plane magnetization state. In the case of in-plane magnetization, it is easy to apply the spin orbit field. Therefore, even when the size of the MTJ increases to some extent, it is possible to reverse magnetization. As a result, information stored in the MTJ is less likely to be lost due to thermal disturbance.

The magnetic field may be applied from the outside in order to cancel a shift magnetic field from the second ferromagnetic layer 74. It is preferable that the magnetic field be applied in a direction in which a main component is in the xy plane. For example, the magnetic field is an in-plane magnetic field.

<Perpendicular Magnetization MTJ>

The first ferromagnetic layer 72 functions as, for example, a first magnetization pinned layer. In the first ferromagnetic layer 72, for example, magnetization is pinned in a direction that is substantially perpendicular to the surface of the layer. The magnetization direction of the first ferromagnetic layer 72 is substantially parallel to the lamination direction SD1.

The second ferromagnetic layer 74 functions as, for example, a magnetic memory layer. The magnetization direction is substantially perpendicular to the surface of the layer and is substantially parallel to the lamination direction SD1. The magnetization direction can be reversed. A structure in which the first ferromagnetic layer 72 and the second ferromagnetic layer 74 are vertically magnetized is suitable for reducing a size. As a result, it is possible to improve the degree of integration of the memory array 11. In this case, since a wiring length is reduced, an access cycle is reduced and the processing performance is improved. A reduction in the processing time makes it possible to return the mode to the L3 mode or to lengthen the time for which the supply of power is cut in, for example, power gating. Therefore, it is possible to reduce power consumption. The magnetic field may be applied from the outside. In this case, it is preferable that a main component be in the xy plane.

<In-Plane Magnetization MTJ>

The first ferromagnetic layer 72 functions as, for example, a first magnetization pinned layer. In the first ferromagnetic layer 72, for example, magnetization is pinned in a direction that is substantially parallel to the surface of the layer. The direction of the magnetization of the first ferromagnetic layer 72 is substantially perpendicular to the lamination direction SD1.

The second ferromagnetic layer 74 functions as, for example, a magnetic memory layer. The magnetization direction is substantially parallel to the surface of the layer and is substantially perpendicular to the lamination direction SD1. The magnetization direction can be reversed.

When the first ferromagnetic layer 72 and the second ferromagnetic layer 74 are magnetized in the plane, the cross-sectional shape of the MTJ may be flat. In this case, it is easy to maintain an in-plane magnetization state. In the case of in-plane magnetization, it is easy to apply the spin orbit field. Therefore, even when the size of the MTJ increases to some extent, it is possible to reverse magnetization. As a result, information stored in the MTJ is less likely to be lost due to thermal disturbance. The magnetic field may be applied from the outside. In this case, it is preferable that a main component be in the xy plane.

3. Example Using MRAM in which Anisotropy is Changed by Application of Voltage

A case in which a magnetoresistive effect memory (an MRAM in which anisotropy is changed by the application of a voltage) is used as a non-volatile memory will be described. A first ferromagnetic layer is a reference layer having a pinned magnetization direction. A second ferromagnetic layer is a memory layer having a variable magnetization direction, A first non-magnetic layer (spacer layer) is provided between the first ferromagnetic layer and the second ferromagnetic layer.

The first ferromagnetic layer or the second ferromagnetic layer is directly or indirectly connected to a first conductive layer. In addition, the first ferromagnetic layer or the second ferromagnetic layer is directly or indirectly connected to a second conductive layer.

A laminate of the first conductive layer, the first ferromagnetic layer, the first non-magnetic layer, the second ferromagnetic layer, and the second conductive layer is referred to as a laminate SB1.

Here, the materials forming the first ferromagnetic layer and the second ferromagnetic layer are the same as those in the STT-MRAM. In addition, the materials forming the first non-magnetic layer, the first conductive layer, and the second conductive layer are the same as those in the STT-MRAM.

Here, a non-volatile memory device includes: a storage unit that includes a magnetic memory element including the laminate SB1 and a magnetic field application unit that applies a magnetic field including a component which is arranged in a first in-plane direction perpendicular to a lamination direction to the second ferromagnetic layer; and a control unit that is electrically connected to the magnetic memory element and performs a setting operation which changes a voltage between the first ferromagnetic layer and the second ferromagnetic layer in the magnetic memory element from a first set voltage to a second set voltage. In the non-volatile memory device, when a variation in a component of an anisotropic magnetic field of the second ferromagnetic layer in the lamination direction at the time the first set voltage is changed to the second set voltage is ΔH (oersted), the component of the anisotropic magnetic field of the second ferromagnetic layer in the lamination direction is $H_u$ (oersted), a component of the magnetic field, which is applied by the magnetic field application unit, in the first in-plane direction is $H_{ext}$ (oersted), and a component of the anisotropic magnetic field of the second ferromagnetic layer in the first in-plane direction is $H_{dx}$ (oersted), the magnetic field applied by the magnetic field application unit satisfies the conditions represented by the following Expression (1). In this case, a voltage is applied to change the magnetic anisotropy of the second ferromagnetic layer, which results in magnetization reversal. In this case, a magnetization reversal speed varies depending on the level of the second set voltage. Therefore, it is possible to change memory characteristics using a voltage.

$$\Delta H > (H_u + H_{dx}) \frac{(H_u + H_{dx} - H_{ext})}{(H_u + H_{dx} + H_{ext})} \quad \text{[Expression 1]}$$

As another example, the following structure may be used. A first ferromagnetic layer is a reference layer having a pinned magnetization direction. A second ferromagnetic layer is a memory layer having a variable magnetization direction. A first non-magnetic layer (spacer layer) is provided between the first ferromagnetic layer and the second ferromagnetic layer.

The first ferromagnetic layer or the second ferromagnetic layer is directly or indirectly connected to a first conductive layer. In addition, the first ferromagnetic layer or the second ferromagnetic layer is directly or indirectly connected to a second conductive layer.

A laminate of the first conductive layer, the first ferromagnetic layer, the first non-magnetic layer, the second ferromagnetic layer, and the second conductive layer is referred to as a laminate SB1.

Here, the materials forming the first ferromagnetic layer and the second ferromagnetic layer are the same as those in the STT-MRAM. In addition, the materials forming the first non-magnetic layer, the first conductive layer, and the second conductive layer are the same as those in the STT-MRAM.

The laminate SB1 has a structure in which at least a portion of the second ferromagnetic layer is surrounded by a third conductive layer. The third conductive layer faces the laminate SB1, with the protective layer described in the STT-MRAM interposed therebetween, so that it is not electrically connected to the laminate SB1. A voltage can be applied to the third conductive layer. In this case, when a voltage is applied to the third conductive layer at the same time as (or before) a write operation is performed for the second ferromagnetic layer, the magnetic anisotropy of the second ferromagnetic layer is changed, which makes it possible to increase a magnetization reversal speed with respect to a certain current. Since the magnetization reversal speed is changed, it is possible to change memory characteristics using a voltage.

4. Example Using Domain Wall Motion Memory

A case in which a domain wall motion memory (domain wall motion MRAM) is used as a non-volatile memory will be described. A first ferromagnetic layer is a reference layer having a pinned magnetization direction. A second ferromagnetic layer is a memory layer having a variable magnetization direction. The second ferromagnetic layer includes a domain wall, A first non-magnetic layer (spacer layer) is provided between the first ferromagnetic layer and the second ferromagnetic layer.

The first ferromagnetic layer or the second ferromagnetic layer is directly or indirectly connected to a first conductive layer. In addition, the first ferromagnetic layer or the second ferromagnetic layer is directly or indirectly connected to a second conductive layer.

Figure 27:
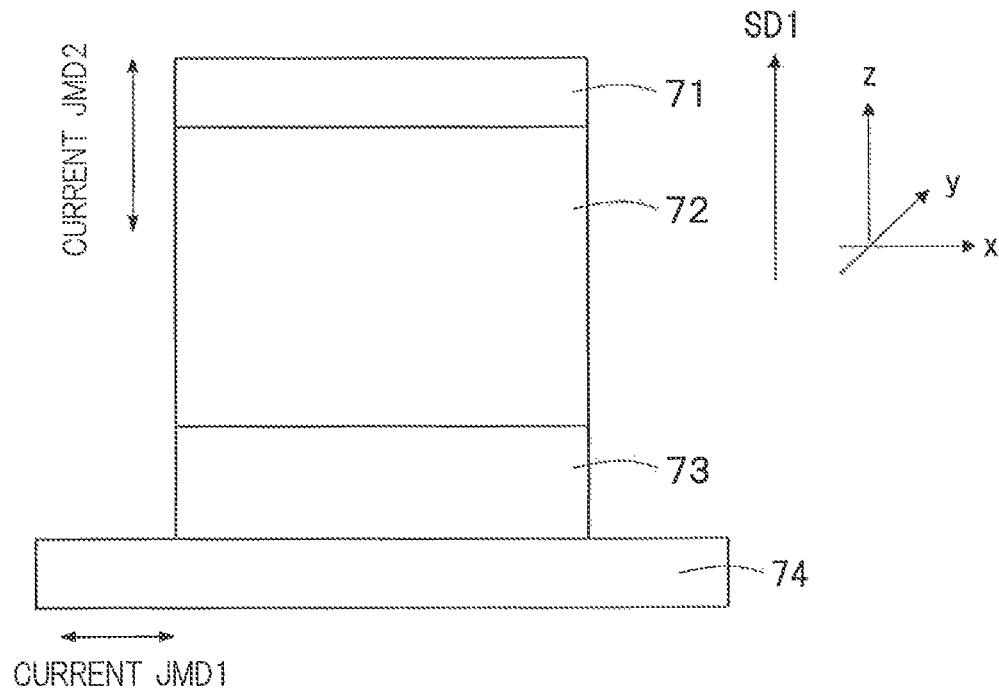
FIG. 27 is a diagram schematically illustrating a laminate of a domain wall motion memory.

A laminate of the first conductive layer, the first ferromagnetic layer, the first non-magnetic layer, the second ferromagnetic layer, and the second conductive layer is referred to as a laminate SB1. FIG. 27 is a diagram schematically illustrating the laminate SB1. For simplicity of illustration, the second conductive layer is not illustrated in FIG. 27.

Here, the materials forming the first ferromagnetic layer and the second ferromagnetic layer are the same as those in the STT-MRAM. In addition, the materials forming the first non-magnetic layer, the first conductive layer, and the second conductive layer are the same as those in the STT-MRAM. JMD1 indicates a current during a write operation and JMD2 indicates a current during a read operation.

<Perpendicular Magnetization MTJ>

A first ferromagnetic layer 62 functions as, for example, a first magnetization pinned layer. In the first ferromagnetic layer 62, for example, magnetization is pinned in a direction that is substantially perpendicular to the surface of the layer.

The magnetization direction of the first ferromagnetic layer 62 is substantially parallel to the lamination direction SD1.

A second ferromagnetic layer 64 functions as, for example, a magnetic memory layer. The magnetization direction of the second ferromagnetic layer is substantially perpendicular to the surface of the layer and is substantially parallel to the lamination direction SD1.

Figure 28:
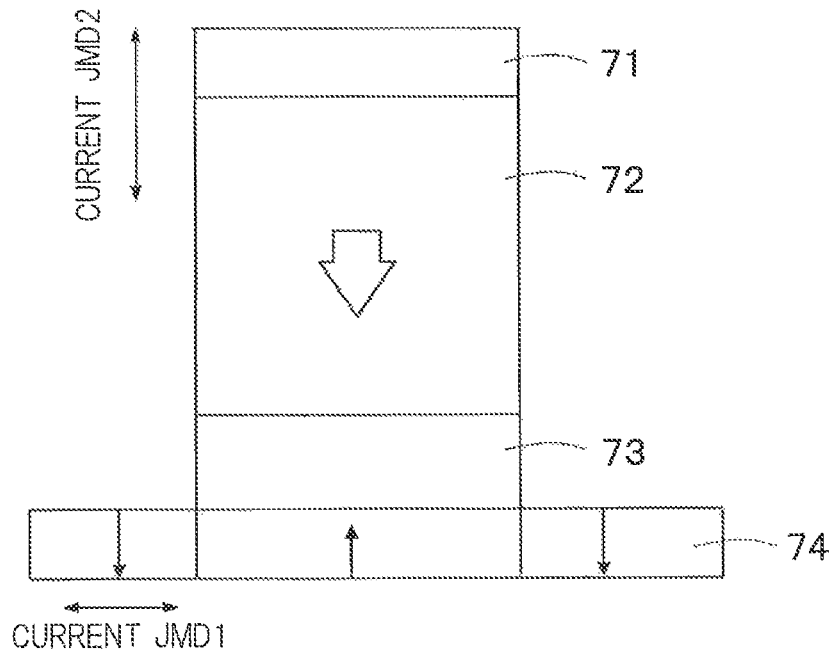
FIG. 28 is a diagram schematically illustrating the laminate of the domain wall motion memory.

The second ferromagnetic layer includes a region which is magnetized in an upward direction and a region which is magnetized in a downward direction. That is, the second ferromagnetic layer includes domain walls. The boundary between the domain walls can be moved in the x direction by the current JMD1. For example, as illustrated in FIG. 28, when the magnetization direction of the first ferromagnetic layer is the downward direction and the magnetization direction of the second ferromagnetic layer is the upward direction in a region that is located below the first ferromagnetic layer in FIG. 28, the magnetization of the laminate SB1 is in an anti-parallel state. In this case, when a read current JMD2 flows, the domain wall is observed as high resistance.

In FIG. 28, when a write current JMD1 flows, the position of the domain wall is moved in the x direction. Then, in the region that is located below the first ferromagnetic layer in FIG. 28, when the magnetization direction of the second ferromagnetic layer is the downward direction, the magnetization of the laminate SB1 is in a parallel state. In this case, when the read current JMD2 flows, the domain wall is observed as low resistance.

<In-Plane Magnetization MTJ>

A first ferromagnetic layer 62 functions as, for example, a first magnetization pinned layer. In the first ferromagnetic layer 62, for example, magnetization is pinned in a direction that is substantially parallel to the surface of the layer. The magnetization direction of the first ferromagnetic layer 62 is substantially perpendicular to the lamination direction SD1.

A second ferromagnetic layer 64 functions as, for example, a magnetic memory layer. The magnetization direction of the second ferromagnetic layer is substantially parallel to the surface of the layer and is substantially perpendicular to the lamination direction SD1. The second ferromagnetic layer includes a region which is magnetized in a right direction and a region which is magnetized in a left direction, That is, the second ferromagnetic layer includes domain walls. A method for moving the domain wall and the resistance state of the domain wall are the same as those in the perpendicular magnetization MTJ.

In particular, in some cases, when a material, such as MnSi, FeGe, $Cu_2OSeO_3$, $BaFe_{12-x}Sc_xO_{19}$, $La_{2-x}Sr_{1+x}Mn_2O_7$, $Fe_{1-x}Co_xSi$, $Mn_{1-x}Fe_xGe$, $Mn_{1-x}Fe_xSi$, or $Ba(Fe_{1-x-0.05}Sc_xMg_{0.05})_{12}O_{19}$, is used, skyrmions are formed in a magnetic body. When a thin second ferromagnetic layer 64 is made of a material, such as MnSi or FeGe, which has a chiral crystal structure without reversal symmetry, such as a B20 structure, skyrmions are likely to be formed. The material forming the second ferromagnetic layer 64 is not limited to the above-mentioned materials. The second ferromagnetic layer 64 may be made of any material as long as it can form skyrmions. The skyrmion has topological stability and can be driven with a lower current density than the domain wall. For example, JMD1 can be less than that in the domain wall.

5. Example Using Resistance Random Access Memory

A case in which a resistance random access memory is used as a non-volatile memory will be described. The resistance random access memory includes a first electrode, a second electrode, and a resistance-change film which is connected to between the first and second electrodes and can reversibly change between first and second resistance states. The positional relationship between the first and second electrodes in the vertical direction is not particularly limited. For example, the second electrode may be provided above the first electrode or the first electrode may be provided above the second electrode. In addition, each of the first and second electrodes and the resistance-change film may have a single-level structure or a multi-layer structure including a plurality of layers. A diode may be connected in series to a resistance-change element including the first and second electrodes and the resistance-change film. The first and second electrodes include a metal, such as Ni, Pt, Au, Ag, Cu, Ru, Ir, Co, Ti, Al, Rh, Nb, or W, a conductive semiconductor doped with impurities, such as polysilicon, or a silicide of the metal and the conductive semiconductor. In addition, the first and second electrodes may include a compound, such as TiAlN, $SrRuO_3$, RuN, TiN, TaN, $LaNiO_x$, $PtIrO_x$, $PtRhO_x$, TaAlN, or $InSnO_x$. The resistance-change film includes a metal oxide, such as $HfO_x$, $SiO_x$, $Ta_xO_y$, ZnO, $TiO_2$, NiO, $WO_x$, $Nb_2O_5$, $CuO_2$, $Al_xO_y$, CoO, $Fe_2O_3$, $SrTiO_3$, $SrZrO_3$, or $(BaSr)TiO_3$. The resistance-change film can reversibly change at least two resistance states.

In this case, when a voltage value applied to the memory changes, the time required to change a state changes, similarly to the STT-MRAM.

6. Example Using Phase-Change Memory

A case in which a phase-change memory is used as a non-volatile memory will be described. The phase-change memory includes a first electrode, a second electrode, and a resistance-change film which is connected to between the first and second electrodes and can reversibly change between first and second resistance states. The positional relationship between the first and second electrodes in the vertical direction is not particularly limited. For example, the second electrode may be provided above the first electrode or the first electrode may be provided above the second electrode. In addition, each of the first and second electrodes and the resistance-change film may have a single-level structure or a multi-layer structure including a plurality of layers. A diode may be connected in series to a resistance-change element including the first and second electrodes and the resistance-change film. The first and second electrodes include a metal, such as Ni, Pt, Au, Ag, Cu, Ru, Ir, Co, Ti, Al, Rh, Nb, or W, a conductive semiconductor doped with impurities, such as polysilicon, or a silicide of the metal and the conductive semiconductor. In addition, the first and second electrodes may include a compound, such as TiAlN, $SrRuO_3$, RuN, TiN, TaN, $LaNiO_x$, $PtIrO_x$, $PtRhO_x$, TaAlN, or $InSnO_x$. The resistance-change film may include a material having chalcogenide as a base and other materials. For example, chalcogenide includes group VIA elements, such as oxygen (O), sulfur (S), selenium (Se), and tellurium (Te), in the periodic table. In addition, chalcogenide may include group IVA elements, such as germanium (Ge) and tin (Sn). Furthermore, chalcogenide may include antimony (Sb), gallium (Ga), indium (In), and silver (Ag). In addition, the first and second electrodes may be made of a compound, such as Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te/, Ge/Sb/Se/Te, or Te/Ge/Sb/S. For example, a compound, such as $Te_aGe_bSb_{100-(a+b)}$, is given as an example of Ge/Sb/Te. In addition, $Ge_2Sb_2Te_5$, $GeSb_2Te_4$, and $GeSb_4Te_7$ are given as examples of Ge/Sb/Te. The resistance-change film may include a transition metal such as chromium (Cr), iron (Fe), nickel (Ni), niobium (Nb), palladium (Pd), or platinum (Pt). A mixture or a compound of the metal and Ge/Sb/Te may be used.

In this case, when a voltage value applied to the memory changes, the time required to change a state changes, similarly to the STT-MRAM.

As such, in this embodiment, the access speed of the memory region of the single-level memory 7 which is a non-volatile memory is variable for each partial region 27, if necessary. The single-level memory 7 can achieve the same function as hierarchical cache memories with different access speeds and it is possible to improve the processing performance of the processor 3. In particular, according to this embodiment, it is not necessary to provide plural types of cache memories with different access speeds. Therefore, it is possible to optimize the performance of the single-level memory 7 according to the processing operation of the processor 3, while simplifying the hardware configuration of the memory system 1, and thus to construct a flexible memory system 1. In the single-level memory 7 according to this embodiment, it is possible to dynamically determine to what extent the access speed is increased for each partial region 27. Therefore, it is possible to optimize the structure of hierarchical caches achieved by the single-level memory 7 according to the processing status of the processor. In addition, the single-level memory 7 according to this embodiment can be used in combination with the existing cache memory. The single-level memory 7 can be used for various purposes according to the processing operation of the processor 3.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A memory system comprising:
a non-volatile memory of which access speed is electrically controlled;
first circuitry that selects a first region which is a portion of a memory region of the non-volatile memory; and
second circuitry that adjusts an access speed of the first region to be higher than an access speed of a second region different from the first region in the memory region,
wherein the first circuitry selects the first region on the basis of at least one of a frequency of access, and an access history.

2. The memory system according to claim 1,
wherein the first circuitry selects, as the first region, a region closer to a processor than the second region, in the memory region of the non-volatile memory.

3. The memory system according to claim 1,
wherein the first circuitry permits that plurality of processors access a common first region.

4. The memory system according to claim 1, further comprising:
a first storage that is provided separately from the non-volatile memory and stores at least one of data stored in the non-volatile memory and data to be stored in the non-volatile memory.

5. The memory system according to claim 4,
wherein the first storage comprises one or more levels of cache memories.

6. The memory system according to claim 4,
wherein the first storage comprises a main memory of the processor, and
the non-volatile memory stores at least one of data stored in the main memory and data to be stored in the main memory.

7. The memory system according to claim 1,
wherein the non-volatile memory is a magnetoresistive random access memory (MRAM).

8. A memory system comprising:
a non-volatile memory of which access speed is electrically controlled;
first circuitry that selects a first region which is a portion of a memory region of the non-volatile memory; and
second circuitry that adjusts an access speed of the first region to be higher than an access speed of a second region different from the first region in the memory region,
wherein the first circuitry selects the first region on the basis of at least one of a latency of a processor, an endurance of the non-volatile memory, a frequency of access, and an access history,
wherein the second circuitry changes the access speed of the first region from a first speed to a second speed faster than the first speed, and after a predetermined period of time elapses, returns the access speed of the first region from the second speed to the first speed.

9. A memory system comprising:
a non-volatile memory of which access speed is electrically controlled;
first circuitry that selects a first region which is a portion of a memory region of the non-volatile memory; and
second circuitry that adjusts an access speed of the first region to be higher than an access speed of a second region different from the first region in the memory region,
wherein the first circuitry selects the first region on the basis of at least one of a latency of a processor, an endurance of the non-volatile memory, a frequency of access, and an access history,
wherein the first regions is closer to a processor than the second region.

10. A memory system comprising:
a non-volatile memory of which access speed is electrically controlled;
first circuitry that selects a first region which is a portion of a memory region of the non-volatile memory; and
second circuitry that adjusts an access speed of the first region to be higher than an access speed of a second region different from the first region in the memory region,
wherein the first region comprises a plurality of sub-regions, and
the second circuitry adjusts such that the access speeds of the plurality of sub-regions are different from one another.

11. The memory system according to claim 10,
wherein the distances of the plurality of sub-regions from the processor are different from one another, and
the first circuitry adjusts the access speed such that the access speed is higher in the sub-region which is closer to the processor.

12. The memory system according to claim 10,
wherein the plurality of sub-regions are used as a plurality of hierarchical cache memories, and
among the plurality of sub-regions, the sub-region with a higher access speed is used as a lower-order cache memory.

13. A memory system comprising:
a non-volatile memory of which access speed is electrically controlled;
first circuitry that selects a first region which is a portion of a memory region of the non-volatile memory; and
second circuitry that adjusts an access speed of the first region to be higher than an access speed of a second region different from the first region in the memory region,
wherein the first circuitry is permitted to select a plurality of the first regions, and
when the first circuitry selects the plurality of first regions, the second circuitry adjusts the access speed of each of the plurality of first regions to be higher than the access speed of the second region.

14. The memory system according to claim 13,
wherein the first circuitry selects the plurality of first regions in association with different processors.

15. A memory system comprising:
a non-volatile memory of which access speed is electrically controlled;
first circuitry that selects a first region which is a portion of a memory region of the non-volatile memory; and
second circuitry that adjusts an access speed of the first region to be higher than an access speed of a second region different from the first region in the memory region,
wherein the first circuitry selects the first region on the basis of at least one of a latency of a processor, an endurance of the non-volatile memory, a frequency of access, and an access history,
wherein the second circuitry adjusts a voltage in the first region to be higher than a voltage in the second region.

16. The memory system according to claim 15,
wherein, when the first region comprises a plurality of sub-regions each having different access speed, the second circuitry adjusts the voltage such that the voltage is higher as the access speed of the sub-region is higher.

17. The memory system according to claim 15,
wherein, when a processor accesses the second region and performs a process, an interrupt process is performed, and
when the processor performs the interrupt process, the first circuitry moves data, which is used in the process performed by the processor before the interrupt process is performed, from the second region to the first region.

18. The memory system according to claim 15,
wherein, when a processor accesses the first region and performs a process, an interrupt process is performed, and
when the processor performs the interrupt process, the first circuitry moves data, which is used in the process performed by the processor before the interrupt process is performed, from the first region to the second region.

19. The memory system according to claim 15,
wherein the non-volatile memory is a magnetoresistive random access memory (MRAM).

* * * * *